United States Patent
Peker et al.

(10) Patent No.: US 7,299,368 B2
(45) Date of Patent: Nov. 20, 2007

(54) HIGH POWER ARCHITECTURE FOR POWER OVER ETHERNET

(75) Inventors: Arkadiy Peker, New Hyde Park, NY (US); Dror Korcharz, Bat Yam (IL); Alon Ferentz, Bat Yam (IL); Yair Darshan, Petach Tikva (IL)

(73) Assignee: Microsemi Corp.-Analog Mixed Signal Group Ltd., Hod Hasharon (IL)

( * ) Notice: Subject to any disclaimer, the term of this patent is extended or adjusted under 35 U.S.C. 154(b) by 417 days.

(21) Appl. No.: 11/036,063

(22) Filed: Jan. 18, 2005

(65) Prior Publication Data

US 2005/0122140 A1    Jun. 9, 2005

Related U.S. Application Data

(63) Continuation-in-part of application No. 10/761,327, filed on Jan. 22, 2004.

(60) Provisional application No. 60/512,362, filed on Oct. 16, 2003.

(51) Int. Cl.
*G06F 1/00* (2006.01)
*G06F 1/32* (2006.01)
*G06F 11/30* (2006.01)

(52) U.S. Cl. .................. 713/300; 713/320; 713/340

(58) Field of Classification Search ............. 713/300, 713/320, 340
See application file for complete search history.

(56) References Cited

U.S. PATENT DOCUMENTS

| | | | |
|---|---|---|---|
| 5,266,838 A | 11/1993 | Gerner | |
| 5,404,090 A * | 4/1995 | Shinbori | 307/66 |
| 5,652,893 A | 7/1997 | Ben Meir et al. | 395/750 |
| 5,834,925 A | 11/1998 | Chesavage | |
| 5,844,327 A | 12/1998 | Batson | |
| 5,914,585 A | 6/1999 | Grabon | |
| 6,009,000 A | 12/1999 | Siri | |
| 6,115,468 A | 9/2000 | De Nicolo | |
| 6,121,693 A | 9/2000 | Rock | |
| 6,153,946 A | 11/2000 | Koch et al. | |
| 6,377,874 B1 | 4/2002 | Ykema | |
| 6,385,024 B1 * | 5/2002 | Olson | 361/87 |
| 6,473,608 B1 | 10/2002 | Lehr | |
| 6,535,983 B1 | 3/2003 | McCormack et al. | |
| 6,628,011 B2 | 9/2003 | Droppo et al. | |
| 6,643,566 B1 | 11/2003 | Lehr | |

(Continued)

OTHER PUBLICATIONS

IEEE 802.3af-2003 Standard—Data Terminal Equipment Power via Media Dependent Interface.

*Primary Examiner*—Rehana Perveen
*Assistant Examiner*—Michael J. Brown
(74) *Attorney, Agent, or Firm*—Simon Kahn

(57) ABSTRACT

Power sourcing equipment providing a plurality of power sources for connection over communication cabling to a single powered device, the power sourcing equipment comprising: a first power source; a second power source; a control circuit; a current sensor adapted to monitor an output current of the first power source, the current sensor being operatively connected to the control circuit; and a voltage regulating means associated with one of the first power source and the second power source, the voltage regulating means being responsive to the control circuit, the control circuit being operative responsive to the monitored output current to operate the voltage regulating means so as to maintain the monitored output current within a pre-determined range.

24 Claims, 22 Drawing Sheets

U.S. PATENT DOCUMENTS

| | | |
|---|---|---|
| 6,665,404 B2 | 12/2003 | Cohen |
| 6,791,208 B2 * | 9/2004 | Pfeiffer ........................ 307/64 |
| 7,225,345 B2 * | 5/2007 | Korcharz et al. ........... 713/300 |
| 2002/0079962 A1 | 6/2002 | Sander |
| 2003/0099076 A1 | 5/2003 | Elkayam |
| 2003/0141907 A1 | 7/2003 | Canova et al. |
| 2004/0201931 A1 | 10/2004 | Korcharz et al. ............. 361/18 |

* cited by examiner

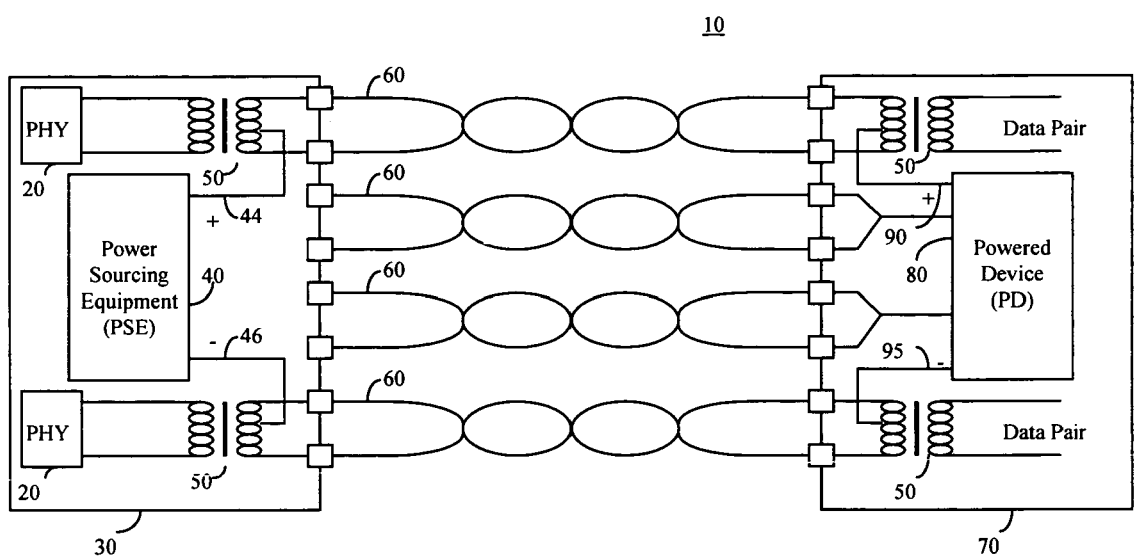
Fig. 1a   *Prior Art*

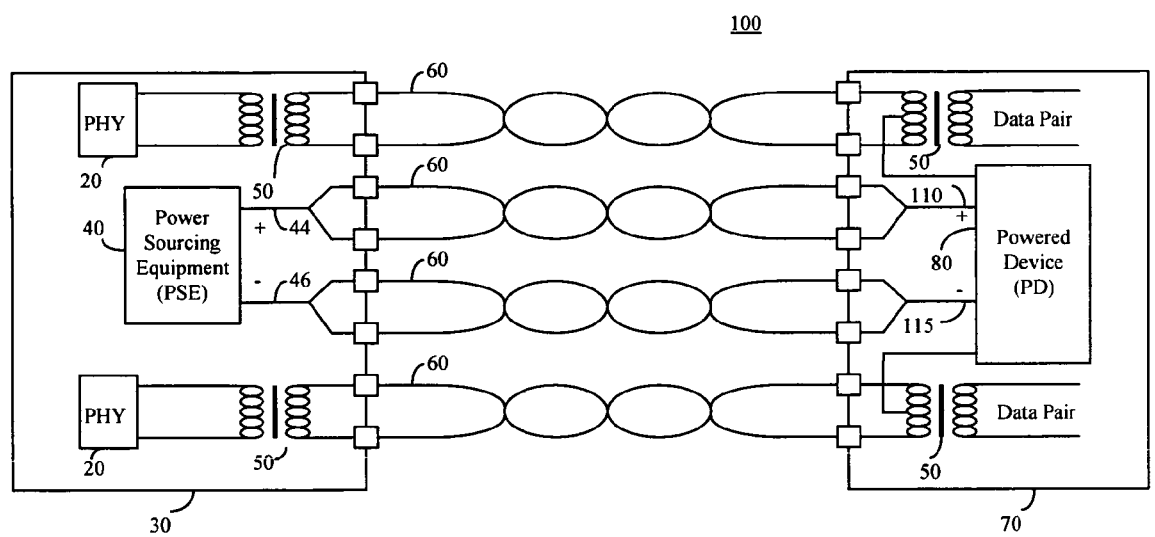
Fig. 1b  *Prior Art*

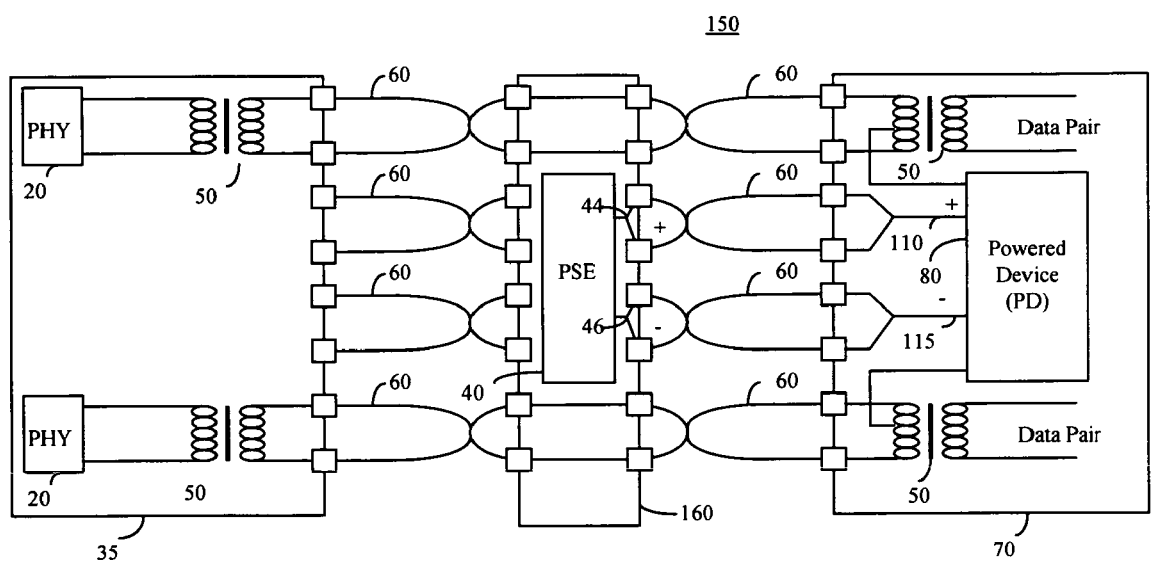
Fig. 1c  *Prior Art*

HIGH POWER ARCHITECTURE FOR POWER OVER ETHERNET

CROSS REFERENCE TO RELATED APPLICATIONS

This application is a continuation-in-part of U.S. patent application Ser. No. 10/761,327 filed Jan. 22, 2004 entitled "High Power Architecture for Power Over Ethernet", which claims priority from U.S. Provisional Patent Application 60/512,362 filed Oct. 16, 2003 entitled "POWERED DEVICE ASIC" the contents of both of which are incorporated herein by reference.

BACKGROUND OF THE INVENTION

The invention relates generally to the field of power over local area networks, particularly Ethernet based networks, and more particularly to an architecture enabling shared power from a plurality of power sources.

The growth of local and wide area networks based on Ethernet technology has been an important driver for cabling offices and homes with structured cabling systems having multiple twisted wire pairs. The ubiquitous local area network, and the equipment which operates thereon, has led to a situation where there is often a need to attach a network operated device for which power is to be advantageously supplied by the network over the network wiring. Supplying power over the network wiring has many advantages including, but not limited to; reduced cost of installation; centralized power and power back-up; and centralized security and management.

The IEEE 802.3af-2003 standard, whose contents are incorporated herein by reference, is addressed to powering remote devices over an Ethernet based network. The above standard is limited to a powered device (PD) having a maximum power requirement during operation of 12.95 watts. Power can be delivered to the PD either directly from the switch/hub known as an endpoint power sourcing equipment (PSE) or alternatively via a midspan PSE. Unfortunately, no provision has been made in the above standard for PDs requiring power in excess of the above maximum power requirement. It is understood by those skilled in the art, that the above power limitation is primarily a function of the power carrying capabilities of the installed twisted wire pairs being utilized to deliver power.

Several patents addressed to the issue of supplying power to a PD over an Ethernet based network exist including: U.S. patent Ser. No. 6,473,608 issued to Lehr et al., whose contents are incorporated herein by reference; U.S. patent Ser. No. 6,643,1066 issued to Lehr et al., whose contents are incorporated herein by reference; and U.S. patent Ser. No. 6,1110,468 issued to De Nicolo whose contents are incorporated herein by reference. Each of the above mentioned patents similarly observe the above power limitation, since this limitation is a function of the power carrying capabilities of the twisted wire pairs being utilized.

It would therefore be desirable to have an architecture enabling powering remote devices over an Ethernet network having high power needs.

SUMMARY OF THE INVENTION

Accordingly, it is a principal object of the present invention to overcome the disadvantages of prior art in powering remote devices. This is provided in the present invention by an architecture enabling simultaneous power feeding from multiple sources over two sets of wire pairs, with power sharing being controlled by the operation of the power sourcing equipment.

In particular the invention provides for a local area network adapted to supply power to at least one powered device over a plurality of communication cabling paths, the local area network comprising: a powered device; power sourcing equipment; and communication cabling comprising a plurality of twisted wire pairs connecting the power sourcing equipment to the powered device, the communication cabling providing a first power path comprising a first set of twisted wire pairs of the communication cabling and a second power path comprising a second set of twisted wire pairs of the communication cabling, the first set being different from the second set; the power sourcing equipment comprising: a control circuit; a first power source responsive to the control circuit adapted to supply a first power to the powered device via the first power path; a second power source responsive to the control circuit adapted to supply a second power to the powered device via the second power path, the control circuit being operative to control the first power source such that a current component of the first power is maintained within a pre-determined range.

In one embodiment the predetermined range is a pre-determined limit of the difference between the current component of the first power and a current component of the second power. In another embodiment the pre-determined range is a pre-determined maximum, the maximum being less than a maximum allowable current from the first power source.

In one embodiment the local area network further comprises a current sensing means associated with one of the first power source and the second power source, the current sensing means being operatively connected to the control circuit, the control circuit being operative responsive to the current sensing means. In another embodiment the local area network further comprises a voltage regulating means associated with one of the first power source and the second power source, the voltage regulating means being responsive to the control circuit, the control of the first power source being a result of the voltage regulating means. In one further embodiment the voltage regulating means comprises one of a linear regulator and a switching regulator, and in another further embodiment the voltage regulating means comprises an FET acting as a linear regulator.

In one embodiment the local area network further comprises an unbalance resistor associated with one of the first power path and the second power path. In another embodiment the control circuit is further operative to control the second power source. In yet another embodiment the power sourcing equipment is associated with midspan power insertion equipment. In yet another embodiment the power sourcing equipment is associated with endpoint power insertion equipment.

In one embodiment the communication cabling is adapted for communicating data to and from the powered device according to at least one of 10 Base-T, 100 Base-T and 1000 Base-T. In yet another embodiment local area network further comprises an under-voltage lockout circuit associated with the powered device, the under-voltage lockout circuit being operative to sense the supplied first power and the supplied second power, the under-voltage lockout circuit being further operative to enable power to the powered device responsive to the sensed supplied first power and the sensed supplied second power. In an exemplary embodiment the powered device comprises one of: a wireless access point; a laptop computer; a desk top computer; a security camera having at least one of pan, tilt and zoom functionality; and an entrance control device.

The invention also provides for power sourcing equipment providing a plurality of power sources for connection over communication cabling to a single powered device, the power sourcing equipment comprising: a first power source; a second power source; a control circuit; a current sensor adapted to monitor an output current of the first power source, the current sensor being operatively connected to the control circuit; and a voltage regulating means associated with one of the first power source and the second power source, the voltage regulating means being responsive to the control circuit, the control circuit being operative responsive to the monitored output current to operate the voltage regulating means so as to maintain the monitored output current within a pre-determined range.

In one embodiment the pre-determined range is a pre-determined limit of a difference between a current output of the first power source and a current output of the second power source. In another embodiment the pre-determined range is a pre-determined maximum, the maximum being less than a maximum allowed current.

In one embodiment the voltage regulating means comprises one of a linear regulator and a switching regulator. In another embodiment the voltage regulating means comprises an FET acting as a linear regulator. In yet another embodiment the power sourcing equipment further comprises an unbalance resistor associated with one of the first power source and the second power source.

The invention also provides for a method for sharing power providing to a powered device over communication cabling, the method comprising: supplying a first power to a powered device over communication cabling; monitoring a current of the supplied first power; supplying a second power to the powered device over communication cabling; regulating a voltage associated with one of the supplied first power and the supplied second power responsive to the monitored current so as to maintain the monitored current within a pre-determined range.

In one embodiment the pre-determined range is a pre-determined limit of a difference between the monitored current of the supplied first power and a current of the second power source. In another embodiment the pre-determined range is a pre-determined maximum, the maximum being less than a maximum allowed current. In yet another embodiment the method further comprises: monitoring a current of the supplied second power, wherein the pre-determined range is a predetermined limit of a difference between the monitored current of the supplied first power and the monitored current of the second power source.

Additional features and advantages of the invention will become apparent from the following drawings and description.

BRIEF DESCRIPTION OF THE DRAWINGS

For a better understanding of the invention and to show how the same may be carried into effect, reference will now be made, purely by way of example, to the accompanying drawings in which like numerals designate corresponding sections or elements throughout.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. In the accompanying drawings:

FIG. 1a illustrates a high level block diagram of a first alternative network configuration for remote powering from an endpoint PSE known to the prior art;

FIG. 1b illustrates a high level block diagram of a second alternative network configuration for remote powering from an endpoint. PSE known to the prior art;

FIG. 1c illustrates a high level block diagram of an alternative network configuration for remote powering from a midspan PSE known to the prior art;

FIG. 5a illustrates a high level flow chart of a preferred operation of a control circuit of FIG. 3a;

DETAILED DESCRIPTION OF THE PREFERRED EMBODIMENTS

Figure 2A:
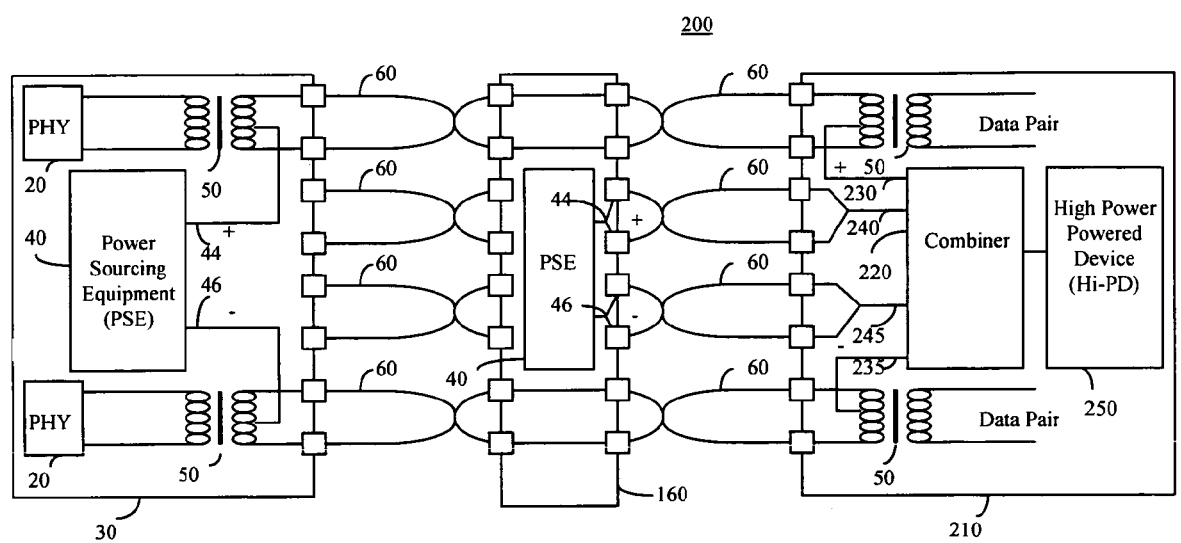
FIG. 2a illustrates a high level block diagram a first embodiment of multiple path power feeding according to the principle of the invention.

The present embodiments enable an architecture for power feeding over a first set of wire pairs utilized for communicating data to and from a powered device requiring high power and simultaneous power feeding over a second set of wire pairs. In one embodiment the second set of wire pairs are spare pairs not utilized for data communication. In another embodiment the second set of wire pairs are utilized for data communications, for example in the case of 1000 Base-T or Gigabit Ethernet. For the purposes of this patent, high power needs are defined as power needs in excess of 12.95 watts at the PD end, the 12.95 watt power limit being defined by the IEEE802.3af-2003 standard. A combined high power output is hereinafter interchangeably called a high power signal. The term power is meant to include any combination of electrical voltage and current capable of supplying power to a PD, and is interchangeably used herein with the term power signal.

A high power PD may comprise: a wireless access point; laptop computer; desk top computer; security camera having pan, tilt zoom functionality; or an entrance control. The invention is operable by hub equipment operable according to any of 10 Base-T, 100 Base-T and 1000 Base-T.

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

The invention is being described as an Ethernet based network, with a powered device being connected thereto. It is to be understood that the powered device is preferably an IEEE 802.3 compliant device preferably employing a 10 Base-T, 100 Base-T or 100 Base-T connection.

FIG. 1a illustrates a high level block diagram of a first alternative network configuration 10 for remote powering from an endpoint PSE known to the prior art. Network configuration 10 comprises: switch/hub equipment 30 comprising first and second physical layer (PHY) controllers 20, power sourcing equipment (PSE) 40 having positive output lead 44 and negative power output lead 46, and first and second transformers 50; first, second, third and fourth twisted pair connections 60; and powered end station 70 comprising powered device (PD) 80 having positive and negative power input leads 90, 95 and third and fourth transformers 50. Positive output lead 44 and negative output lead of PSE 40 are connected, respectively, to the center tap of the secondary of first and second transformers 50. The primary of first and second transformers 50 are each connected to communication devices, typically through first and second PHY 20, respectively. The output leads of the secondary of first and second transformers 50 are each connected to a first end of first and second twisted pair connections 60, respectively. The second end of first and second twisted pair connections 60, are respectively connected to the primary of third and fourth transformers 50 located within powered end station 70. The center tap of the primary of third transformer 50 is connected to positive power input 90 of PD 80. The center tap of the primary of fourth transformer 50 is connected to negative power input 95 of PD 80. In a preferred embodiment, first and second transformers 50 are part of PSE 40, and third and fourth transformers 50 are part of PD 80.

In operation, PSE 40 supplies power over first and second twisted pair connection 60, thus supplying both power and data over first and second twisted pair connections 60 to PD 80. Third and fourth twisted pair connections 60 are not utilized, and are thus available as spare connections. Third and fourth twisted pair connections 60 are shown connected to PD 80 in order to allow operation alternatively in a manner that will be described further hereinto below in relation to FIG. 1b over unused third and fourth twisted pair connections 60. Positive power input lead 90 of PD 80 is operatively connected to positive power output lead 44 of PSE 40 through first twisted pair connection 60, center tapped primary of third transformer 50 and the center tapped secondary of first transformer 50. Negative power input lead 95 of PD 80 is operatively connected to negative power output lead 46 of PSE 40 through second twisted pair connection 60, the center tapped primary of fourth transformer 50 and the center tapped secondary of second transformer 50.

FIG. 1b illustrates a high level block diagram of a second alternative network configuration 100 for remote powering from an endpoint PSE known to the prior art. Network configuration 100 comprises: switch/hub equipment 30 comprising first and second PHY 20, PSE 40 having positive power output lead 44 and negative power output lead 46, and first and second transformers 50; first, second, third and fourth twisted pair connections 60; and powered end station 70 comprising PD 80 having positive power input lead 110 and negative power input lead 115, and third and fourth transformers 50. The primary of first and second transformers 50 are connected to communication devices, typically through first and second PHY 20, respectively. The output leads of the secondary of first and second transformers 50 are each connected to a first end of first and second twisted pair connections 60, respectively. Positive power output lead 44 of PSE 40 is connected to both leads of third twisted pair connection 60 and negative power output lead 46 of PSE 40 is connected to both leads of fourth twisted pair connection 60. The second end of first and second twisted pair connection 60 is connected to the primary of third and fourth transformer 50, respectively, located within powered end station 70. The center tap of the primary of third and fourth transformer 50 is connected to PD 80. The second end of third and fourth twisted pair connections 60 are respectively connected to positive and negative power inputs 110 and 115 of PD 80. In a preferred embodiment, first and second transformers 50 are part of PSE 40, and third and fourth transformers 50 are part of PD 80.

In operation PSE 40 supplies power to PD 80 over third and fourth twisted pair connection 60, with data being supplied over first and second twisted pair connection 60. Power and data are thus supplied over separate connections, and are not supplied over a single twisted pair connection. The center tap connection of third and fourth transformer 50 is not utilized, but is shown connected in order to allow operation alternatively as described above in relation to network configuration 10 of FIG. 1a. Network configurations 10 and 100 thus allow for powering of PD 80 by PSE 40 either over the set of twisted pair connections 60 utilized for data communications, or over the set of twisted pair connections 60 not utilized for data communications.

FIG. 1c illustrates a high level block diagram of an alternative network configuration 150 for remote powering from a midspan PSE known to the prior art. Network configuration 150 comprises: switch/hub equipment 35 comprising first and second PHY 20 and first and second transformers 50; first through eighth twisted pair connections 60; powered end station 70 comprising PD 80 having positive power input lead 110 and negative power input lead 115, and third and fourth transformers 50; and midspan power insertion equipment 160 comprising PSE 40 having positive power output lead 44 and negative power output lead 46. The primary of first and second transformers 50 are connected, respectively, to communication devices typically through first and second PHY 20. The output leads of the secondary of first and second transformers 50 are connected, respectively, to a first end of first and second twisted pair connections 60. The second end of first and second twisted pair connections 60 are connected as a straight through connection through midspan power insertion equipment 160 to a first end of fifth and sixth twisted pair connections 60, respectively. A second end of fifth and sixth twisted pair connections 60 are connected to the primary of third and fourth transformer 50, respectively, located within powered end station 70. Third and fourth twisted pair connections 60 are shown connected between switch/hub 35 and midspan power insertion equipment 160, however no internal connection to either third of fourth twisted pair connection is made.

Positive power output lead 44 of PSE 40 is connected to both leads of one end of seventh twisted pair connection 60 and negative power output lead 46 of PSE 40 is connected to both leads of one end of eighth twisted pair connection 60. The second end of both leads of seventh and eighth twisted pair connections 60 are respectively connected to positive and negative power inputs 110, 115 of PD 80. In a preferred embodiment, third and fourth transformers 50 are part of PD 80. The center tap of the primary of third and fourth transformer 50, located within powered end station 70, is connected to PD 80.

In operation PSE 40 of midspan power insertion equipment 160 supplies power to PD 80 over seventh and eighth twisted pair connections 60, with data being supplied from switch/hub equipment 35 over first and second twisted pair connections 60 through midspan power insertion equipment 160 to fifth and sixth twisted pair connections 60. Power and data are thus supplied over separate connections, and are not supplied over a single twisted pair connection. The center tap connection of third and fourth transformer 50 is not utilized, but is shown connected in order to allow operation alternatively as described above in relation to network configuration 10 of FIG. 1a.

FIG. 2a illustrates a high level block diagram of a first embodiment of a multiple path power feeding network configuration, herein designated network configuration 200, according to the principle of the invention. Network configuration 200 comprises: switch/hub equipment 30 comprising first and second PHY 20, first and second transformers 50 and first PSE 40 having positive power output lead 44 and negative power output lead 46; first through eighth twisted pair connections 60; midspan power insertion equipment 160 comprising second PSE 40 having positive output lead 44 and negative power output lead 46; and high powered end station 210 comprising third and fourth transformers 50, power combiner 220 having first positive power input 230, first negative power input 235, second positive power input 240 and second negative power input 245 and high powered PD (Hi-PD) 250.

The primary of first and second transformers 50 are respectively connected to communication devices typically through first and second PHY 20. The output leads of the secondary of first and second transformers 50 are each connected to a first end of first and second twisted pair connections 60, respectively. The center taps of the secondary of first and second transformers 50 are connected, respectively, to positive and negative power output leads 44, 46 of first PSE 40. The second end of first and second twisted pair connections 60 are connected as a pass-through connection through midspan power insertion equipment 160 to a first end of fifth and sixth twisted pair connections 60, respectively. A second end of fifth and sixth twisted pair connections 60 are connected to the primary of third and fourth transformer 50, respectively, located within powered end station 210. Third and fourth twisted pair connections 60 are shown connected between switch/hub 30 and midspan power insertion equipment 160 however no internal connection to either end of third or fourth twisted pair connection 60 is made.

The center tap of the primary of third transformer 50 is connected to positive power input 230 of power combiner 220, and the center tap of the primary of fourth transformer 50 is connected to negative power input 235 of power combiner 220. Positive power output lead 44 of second PSE 40 is connected to both leads of a first end of seventh twisted pair connection 60 and negative power output lead 46 of second PSE 40 is connected to both leads of a first end of eighth twisted pair connection 60. The second end of both leads of seventh twisted pair connection 60 are connected to positive power input 240 of power combiner 220, and second end of both leads of eight twisted pair connection 60 are connected to negative power input 245 of power combiner 220. The output of power combiner 220 is connected to Hi-PD 250. In an exemplary embodiment power combiner 220 is co-housed with Hi-PD 250.

It is to be understood that twisted pair connections are not restricted to continuous wire pairs. Patch cords, patch panels and other connections may be utilized in place of, or in combination with, direct connections without exceeding the scope of the invention.

In operation first PSE 40 supplies power to power combiner 220 over the combination of first and fifth twisted pair connections 60 and the combination of second and sixth twisted pair connections 60. The combination of first and fifth twisted pair connections 60 and the combination of second and sixth twisted pair connections 60 are simultaneously utilized to carry data. Second PSE 40 supplies power to power combiner 220 over seventh and eighth twisted pair connections 60, thus supplying a second power path over pairs not being utilized to carry data.

Power combiner 220 functions to combine the power supplied by first PSE 40 and second PSE 40 to a combined power output, and optionally to convert the voltages of first PSE 40 and second PSE 40 to an appropriate voltage or voltages for supply to Hi-PD 250. Power combiner 220 further functions to enable each of first and second PSE 40 to detect, and optionally to classify, high powered end station 210 as a powered device. Preferably this detection and optional classification is accomplished in accordance with the applicable IEEE 802.3af standard. Power combiner 220 further functions to combine the power supplied by first and second PSE 40 so as to supply a single high power source to Hi-PD 250.

Figure 2B:
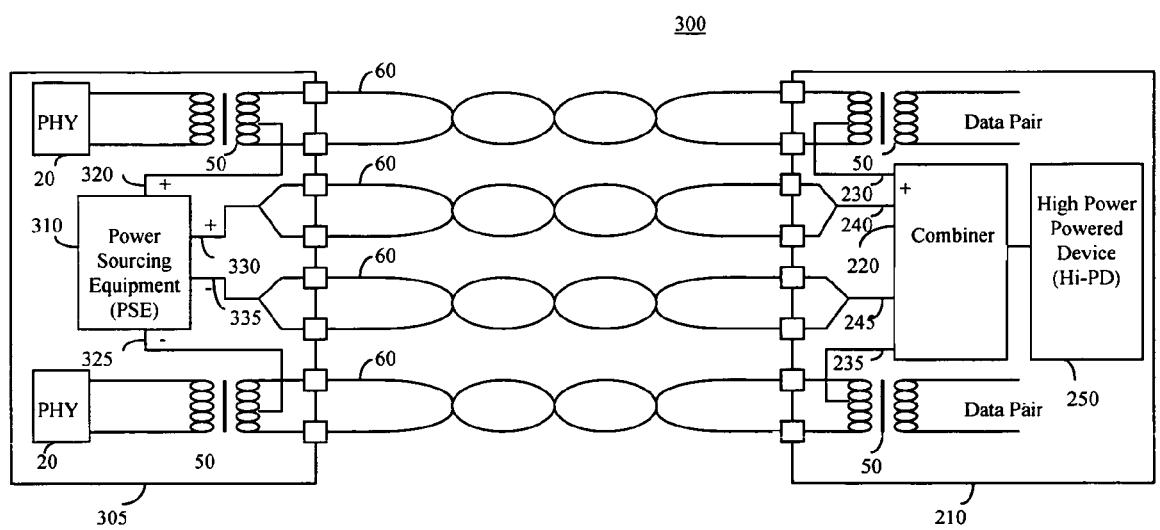
FIG. 2b illustrates a high level block diagram of a second embodiment of multiple path power feeding according to the principle of the invention.

FIG. 2*b* illustrates a high level block diagram of a second embodiment of a multiple path power feeding network configuration, herein designated network configuration 300, according to the principle of the invention. Network configuration 300 comprises: high power switch/hub equipment 305 comprising first and second PHY 20, first and second transformers 50 and PSE 310 having a first power output comprising positive power output lead 320 and negative power-output lead 325, a second power output comprising positive power output lead 330 and negative power output lead 335; first through fourth twisted pair connections 60; and high powered end station 210 comprising third and fourth transformers 50, power combiner 220 having first positive power input 230, first negative power input 235, second positive power input 240 and second negative power input 245 and Hi-PD 250.

The primary of first and second transformers 50 are each connected to communication devices typically through first and second PHY 20, respectively. The output leads of the secondary of first and second transformers 50 are respectively connected to a first end of first and second twisted pair connections 60. The center tap of the secondary of first and second transformers 50 are respectively connected to positive output 320 and negative output 325 of PSE 310. The second end of first and second twisted pair connections 60 are respectively connected to the primary of third and fourth transformer 50 located within high powered end station 210. A first end of both leads of each of third and fourth twisted pair connections 60, respectively, are connected to positive output 330 and negative output 335 of PSE 310.

The center tap of the primary of third and fourth transformers 50 are respectively connected to first positive power input 230 and first negative power input 235 of power combiner 220. A second end of both leads of third and fourth twisted pair connections 60 are respectively connected to second positive power input 240 and second negative power input 245 of power combiner 220. The output of power combiner 220 is connected to Hi-PD 250. In an exemplary embodiment power combiner 220 is co-housed with Hi-PD 250.

In operation, the first output of PSE 310 located in high power switch/hub 305, constituted of positive output 320 and negative output 325, supplies power to power combiner 220 over first and second twisted pair connections 60, simultaneously with data being transmitted over first and second twisted pair connection 60. The second output of PSE 310 located in switch/hub 305, constituted of positive output 330 and negative output 335, supplies power to power combiner 220 over third and fourth twisted pair connections 60. In a first embodiment first and second power outputs of PSE 310 are isolated from each other. In a second embodiment first and second power outputs of PSE 310 are non-isolated from each other. In one exemplary embodiment, first and second power outputs of PSE 310 are separate outputs of a single power source. In another exemplary embodiment, first and second power outputs of PSE 310 are derived from a single output of a single power source. First and second outputs are also termed first and second power sources throughout this document.

Power combiner 220 functions to combine the power supplied by first and second outputs of PSE 310 to a combined power output, and optionally to convert the voltages of first and second outputs of PSE 310 to an appropriate voltage or voltages for supply to Hi-PD 250. Power combiner 220 further functions to enable each of first and second power outputs of PSE 310 to detect, and optionally to classify, high powered end station 210 as a powered device. Preferably this detection and optional classification is accomplished in accordance with the applicable IEEE 802.3af standard. It is to be noted that PSE 310, upon detection and classification on both first and second outputs, is thus notified that high powered end station 210 is operable to draw power from both ports. Power combiner 220 further functions to combine the power supplied by first and second power outputs of PSE 310 so as to supply a single high power source to Hi-PD 250.

Figure 2C:
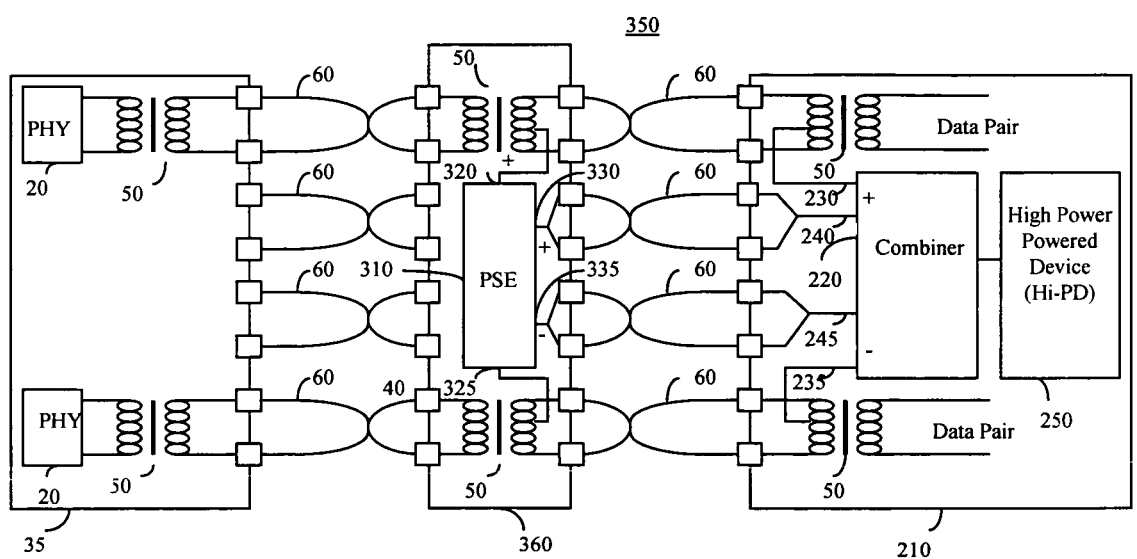
FIG. 2c illustrates a high level block diagram of a third embodiment of multiple path power feeding according to the principle of the invention.

FIG. 2*c* illustrates a high level block diagram of a third embodiment of a multiple path power feeding network configuration, herein designated network configuration 350, according to the principle of the invention. Network configuration 350 comprises: switch/hub equipment 35 comprising first and second PHY 20 and first and second transformers 50; first through eighth twisted pair connections 60; high power midspan power insertion equipment 360 comprising third and fourth transformers 50 and PSE 310 having a first power output comprising positive power output lead 320 and negative power output lead 325, and further having a second power output comprising positive power output lead 330 and negative power output lead 335; and high powered end station 210 comprising fifth and sixth transformers 50, power combiner 220 having first positive power input 230, first negative power input 235, second positive power input 240 and second negative power input 245 and Hi-PD 250.

The primary of first and second transformers 50 are each connected to communication devices typically through first and second PHY 20, respectively. The output leads of the secondary of first and second transformers 50 are respectively connected to a first end of first and second twisted pair connections 60. The second end of each of first and second twisted pair connections 60 are connected to the primary of third and fourth transformer 50, respectively, located within high power midspan power insertion equipment 360. Third and fourth twisted pair connections 60 are connected between switch/hub 30 and high power midspan power insertion equipment 360, however no internal connection is made to either third or fourth twisted pair connection 60.

The center taps of the secondary of third and fourth transformers 50 are connected, respectively, to positive output 320 and negative output 325 of PSE 310. A first end of each of fifth and sixth twisted pair connections 60, respectively, is connected to the secondary of third and fourth transformers 50. A second end of each of fifth and sixth twisted pair connections, respectively, is connected to the primary of fifth and sixth transformers 50, located in high powered end station 210. Both leads of a first end of each of seventh and eighth twisted pair connections 60 are respectively connected to positive output 330 and negative output 335 of PSE 310.

The center tap of the primary of fifth and sixth transformers 50, respectively, is connected to first positive power input 230 and first negative power input 235 of power combiner 220. Both leads of a second end of seventh and eighth twisted pair connections 60, respectively, are connected to second positive power input 240 and second negative power input 245 of power combiner 220. The output of power combiner 220 is connected to Hi-PD 250. In an exemplary embodiment power combiner 220 is co-housed with Hi-PD 250.

In operation, the first output of PSE 310 constituted of positive output 320 and negative output 325, supplies power to power combiner 220 over fifth and sixth twisted pair connections 60, simultaneously with data being transmitted over fifth and sixth twisted pair connection 60 supplied from or to switch/hub 35. The second power output of PSE 310 located in midspan insertion equipment 360, constituted of positive output 330 and negative output 335, supplies power to power combiner 220 over seventh and eighth twisted pair connections 60. In a first embodiment first and second power outputs of PSE 310 are isolated from each other. In a second embodiment first and second power outputs of PSE 310 are non-isolated from each other. In one exemplary embodiment, first and second power outputs of PSE 310 are separate outputs of a single power source. In another exemplary embodiment, first and second power outputs of PSE 310 are derived from a single output of a single power source. First and second outputs are also termed first and second power sources throughout this document.

Power combiner 220 functions to combine the power supplied by first and second outputs of PSE 310 to a combined power output, and optionally to convert the voltages of first and second outputs of PSE 310 to an appropriate voltage or voltages for supply to Hi-PD 250. Power combiner 220 further functions to enable each of first and second power outputs of PSE 310 to detect, and optionally to classify, high powered end station 210 as a powered device. Preferably this detection and optional classification is accomplished in accordance with the applicable IEEE 802.3af standard. It is to be noted that PSE 310, upon detection and classification on both first and second outputs, is thus aware that high powered end station 210 is operable to draw power from both ports. Power combiner 220 further functions to combine the power supplied by first and second power outputs of PSE 310 so as to supply a single high power source to Hi-PD 250. It is to be understood by those skilled in the art that any power inserted by switch/hub 35 in a configuration similar to that shown in FIG. 1*a*, will be blocked at the primary of third and fourth transformers 50. Furthermore, switch/hub 35 will not identify a valid powered device, and thus power will not be supplied over data pairs 60 from switch/hub 35.

Figure 2D:
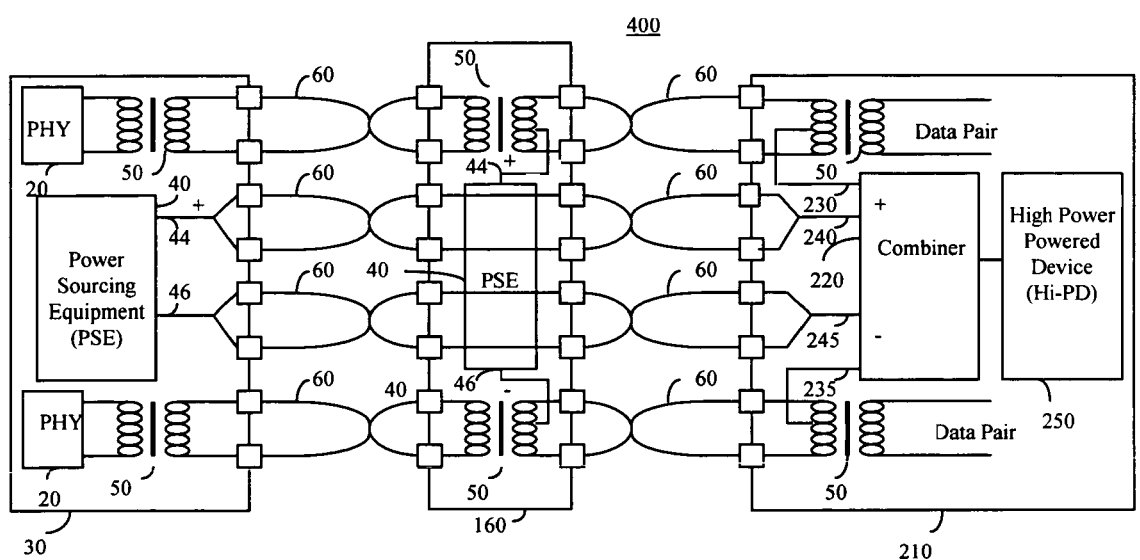
FIG. 2d illustrates a high level block diagram of a fourth embodiment of multiple path power feeding according to the principle of the invention.

FIG. 2*d* illustrates a high level block diagram of a fourth embodiment of a multiple path power feeding network configuration, herein designated network configuration 400, according to the principle of the invention. Network configuration 400 comprises: switch/hub equipment 30 comprising first and second PHY 20, first and second transformers 50 and first PSE 40 having positive power output lead 44 and negative power output leads 46; first through eighth twisted pair connections 60; midspan power insertion equipment 160 comprising third and fourth transformers 50 and second PSE 40 having positive power output lead 44 and negative power output lead 46; and high powered end station 210 comprising fifth and sixth transformers 50, power combiner 220 having first positive power input 230, first negative power input 235, second positive power input 240 and second negative power input 245 and Hi-PD 250.

The primary of first and second transformers 50 are respectively connected to communication devices typically through first and second PHY 20. The output leads of the secondary of first and second transformers 50 are each connected to a first end of first and second twisted pair connections 60, respectively. The second end of first and second twisted pair connections 60 is connected, respectively, to the primary of third and fourth transformers 50 location in midspan power insertion equipment 160. Both leads of a first end of third and fourth twisted pair connections 60, respectively, are connected to positive power output lead 44 and negative power output lead 46 of first PSE 40. The center tap of the secondary of third and fourth transformers 50, respectively, is connected to positive power output lead 44 and negative power output lead 46 of second PSE 40. A first end of fifth and sixth twisted pair connections 60 respectively, are connected to the secondary of third and fourth transformers 50. A second end of fifth and sixth twisted pair connections 60 are connected to the primary of fifth and sixth transformer 50, respectively, located within high powered end station 210. The second end of third and fourth twisted pair connections 60, respectively, are connected as a pass-through connection of midspan power insertion equipment 160 to one end of seventh and eighth twisted pair connections 60, respectively. The second end of both leads of seventh and eight twisted pair connections 60 are respectively connected to second positive power inputs 240 and second negative power input 245 of power combiner 220.

The center tap of the primary of fifth transformer 50 is connected to first positive power input 230 of power combiner 220, and the center tap of the primary of sixth transformer 50 is connected to first negative power input 235 of power combiner 220. The output of power combiner 220 is connected to Hi-PD 250. In an exemplary embodiment power combiner 220 is co-housed with Hi-PD 250.

In operation, first PSE 40 located in switch/hub 30 supplies power to power combiner 220 over the combination of third and seventh twisted pair connections 60 and the combination of fourth and eighth twisted pair connections 60. The combination of first and fifth twisted pair connections 60 and the combination of second and sixth twisted pair connections 60 are utilized to carry data. Second PSE 40 supplies power to power combiner 220 over fifth and sixth twisted pair connections 60, thus supplying a second power path over pairs being utilized to carry data.

Power combiner 220 functions to combine the power supplied by first and second PSE 40 to a combined power output, and optionally to convert the voltages of first and second PSE 40 to an appropriate voltage or voltages for supply to Hi-PD 250. Power combiner 220 further functions to enable each of first and second PSE 40 to detect, and optionally to classify, high powered end station 210 as a powered device. Preferably this detection and optional classification is accomplished in accordance with the applicable IEEE 802.3af standard. Power combiner 220 further functions to combine the power supplied by first and second PSE 40 so as to supply a single high power source to Hi-PD 250.

While the above has been described utilizing a two pairs two carry data, and two spare pairs of wires, this is not meant to be limiting in any way. It is meant to include, without limitation, 1000 Base-T or gigabit Ethernet for which 4 pairs of wire carry data. In such an implementation, all four pairs of wires preferably carry both power and data. In an exemplary embodiment, power is added to all data carrying pairs by high powered midspan insertion equipment in accordance with the principle of the current invention.

Figure 3A:
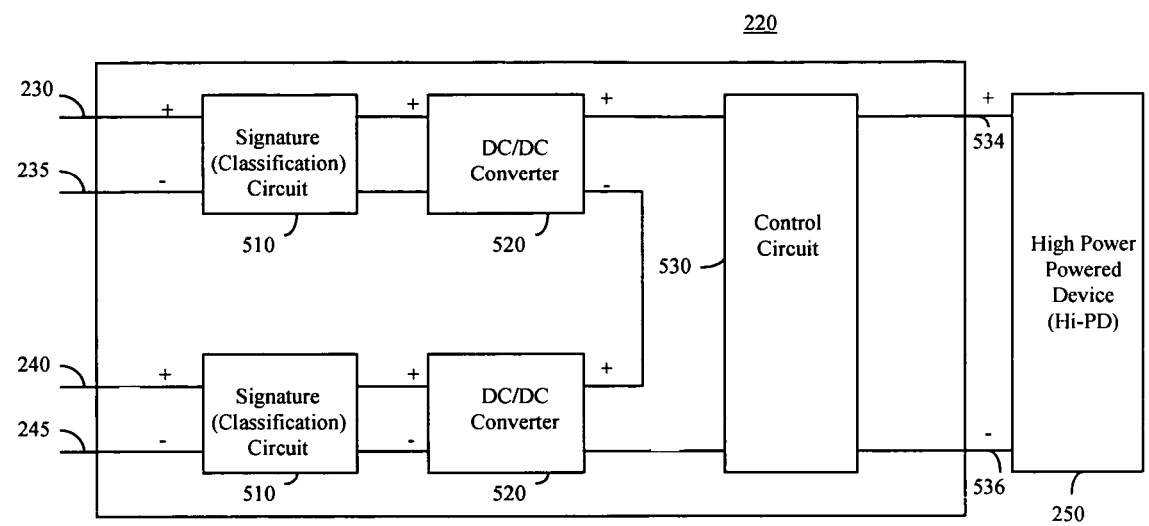
FIG. 3a illustrates a high level block diagram of a first embodiment of a power combiner according to the principle of the current invention.

FIG. 3*a* illustrates a high level block diagram of a first embodiment of a power combiner 220 according to the principle of the current invention comprising first power input having positive lead 230 and negative lead 235, second power input having positive lead 240 and negative lead 245, first and second signature circuits 510, first and second DC/DC converters 520 and control circuit 530 having positive output 534 and negative output 536 shown connected to Hi-PD 250. First positive and negative power input leads 230, 235 respectively, are connected to the input of first signature circuit 510. Second positive and negative power input leads 240, 245 respectively, are connected to the input of second signature circuit 510. The positive and negative outputs of first signature circuit 510 are connected to the input of first DC/DC converter 520 and the positive and negative outputs of second signature circuit 510 are connected to the input of second DC/DC converter 520. First and second DC/DC converters 520 are connected in series, with the negative output of first DC/DC converter 520 connected to the positive output of second DC/DC converter 520. The positive output of first DC/DC converter 520 is connected to the positive input of control circuit 530, and the negative output of second DC/DC converter 520 is connected to the negative input of control circuit 530. Positive output 534 and negative output 536 represent the output of power combiner 220 that is fed to Hi-PD 250 as shown in FIGS. 2a-2d.

In operation first and second signature circuit 510 function to enable first and second PSE 40 of FIGS. 2a and 2d, or each of first and second power outputs of PSE 310 of FIGS. 2b and 2c to detect, and optionally to classify, high powered end station 210 as a powered device. In an exemplary embodiment, first and second signature circuit 510 each function in accordance with the requirements of the IEEE 802.3af standard. In another embodiment, first and second signature circuits 510 do not present a valid classification. In another embodiment a unique class is presented for high power devices. In an alternative embodiment, one or both of first and second signature circuit 510 additionally function to signal at least one of first and second PSE 40 of FIGS. 2a and 2d, or PSE 310 of FIGS. 2b and 2c that high powered end station 210 is a high power device. In a preferred embodiment the signaling is accomplished by switching the classification presented by signature circuit 510 at the end of the classification time period in a manner that will be described further hereinto below in relation to FIG. 4.

Figure 4:
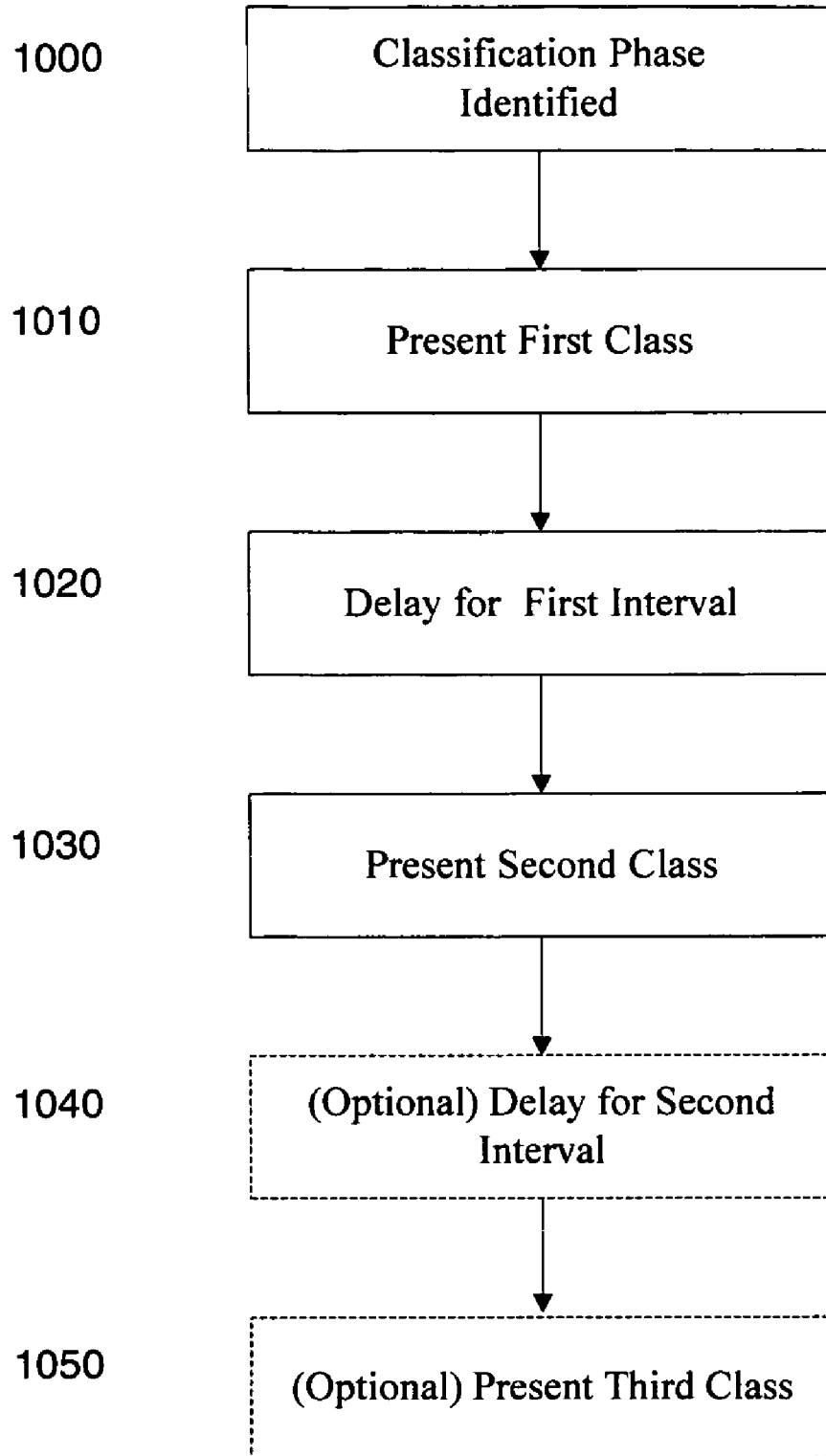
FIG. 4 illustrates a high level flow chart of a preferred operation of a signature circuit of FIG. 3a-FIG. 3e.

FIG. 4 illustrates a high level flow chart of the operation of one or both of first and second signature circuit 510 of FIG. 3a to signal at least one of first and second PSE 40 of FIGS. 2a and 2d, or PSE 310 of FIGS. 2b and 2c that high powered end station 210 is a high power device in accordance with the principle of the invention. In step 1000, signature circuit 510 identifies the classification phase. Preferably, a specified voltage across the input leads identifies the classification phase. In step 1010, a first class is presented. Preferably, a first class is presented by current flow within a specified range.

In step 1020, a first interval is delayed. Preferably, the first interval is equivalent to length of the classification phase as defined in the IEEE802.3af standard. In step 1030, a second class is presented, the second class being different from the first class.

In optional step 1040, a second interval is delayed. Preferably, the second interval is the same as the first interval. In optional step 1050, a third class is presented, the third class being different from the second class. In a preferred embodiment, the third class is also different from the first class.

In the embodiment of FIGS. 2b and 2c, PSE 310 is thus notified of the existence of Hi-PD 250. In one embodiment, PSE 310 relaxes the overload restriction in accordance with a preferred operation of Hi-PD 250. In another embodiment PSE 310 further monitors first and second power outputs (320, 325 and 330, 335) to ensure a balanced load. In the event of an imbalance, optionally PSE 310 shuts down power on both first and second power outputs (330, 335 and 340, 345). In another embodiment, PSE 310 utilizes the notification for fault prediction or maintenance.

In the embodiment of FIGS. 2a and 2d, at least one of first and second PSE 40 is thus notified of the existence of Hi-PD 250, and optionally is operable to relax the overload restriction in accordance with a preferred operation of Hi-PD 250. Preferably, the signaled PSE 40 communicates over existing data paths (not shown) with the non-signaled PSE 40 and notifies it of the joint load, and furthermore that the joint load is Hi-PD 250. Optionally, the non-signaled PSE 40 relaxes the overload restriction in accordance with a preferred operation of Hi-PD 250 in response to the received communication from the signaled PSE 40.

Referring back to FIG. 3a, first and second DC/DC converters 520 function to convert the DC power delivered from first and second PSE 40 of FIGS. 2a, 2d or first and second output of PSE 310 of FIGS. 2b, 2c to the required operating voltage of Hi-PD 250. In a non-limiting exemplary embodiment, approximately 48 Volts appear between positive input 230 and negative input 235, approximately 48 Volts appear between positive input 240 and negative input 245 and Hi-PD 250 is preferably powered by 12V DC. Thus, in the exemplary embodiment, first and second DC/DC converters 520 are each 48V to 6V DC converters known to those skilled in the art. First and second DC/DC converters 520 are preferably of the isolated type, such as a flyback converter, in order to meet isolation needs between the inputs 230, 235 and 240, 245 respectively, and outputs 534, 536 of power combiner 220. Furthermore, isolated DC/DC converters 520 are advantageous when utilized in network configuration 200 of FIG. 2a and network configuration 400 of FIG. 2d wherein power is supplied by both first and second PSE 40 located in disparate equipment. Non-isolated topologies, such as a buck DC/DC converter, are advantageously simpler and thus lower in cost, and are preferably utilized when isolation is not required.

Control circuit 530 functions to ensure that Hi-PD 250 does not receive power from first and second DC/DC converters 520 until both DC/DC converters 520 have stabilized at their normal operating voltage. A further preferred function of control circuit 530 is to provide hot start current limiting, thus preventing an overload of either of first and second DC/DC converters 520 during the initial inrush current of Hi-PD 250. A further preferred function of control circuit 530 is to remove power from Hi-PD 250 in the event of a shut down of one of first and second DC/DC converters 520. It is to be understood that shut down of a DC/DC converter 520 may occur due to a failure of one DC/DC converter 520, or due to a disconnect of power to the DC/DC converter 520 by PSE 40 of FIGS. 2a, 2d or PSE 310 of FIGS. 2b, 2c. A further preferred function of control circuit 530 is to protect power combiner 220 in the event of a short circuit condition across the output leads of power combiner 220. Preferably, in the event of an over-current condition, control circuit 530 disconnects the combined output of first and second DC/DC converters 520 for a pre-determined period of time. Optionally, in a manner that will be explained further below, after expiration of the pre-determined period of time, power is reconnected for a short trial period to test if the short circuit still exists. In another embodiment (not shown) control circuit 530 upon sensing an over-current condition shuts down the operation of first and second DC/DC converters 520.

In one preferred embodiment, control circuit 530 further functions during an overload caused by Hi-PD 250, to turn off power to Hi-PD 250. In a first exemplary embodiment this function is a result of the action of at least one PSE 40 of FIGS. 2a, 2d or at least one output of PSE 310 of FIGS. 2b, 2c, the overload condition having been passed through control circuit 530 to first and second DC/DC converters 520 and further to PSE 40 of FIGS. 2a, 2d or PSE 310 of FIGS. 2b, 2c. In a second exemplary embodiment this function is operative due to the voltage drop at the output of the combination of first and second DC/DC converters 520, the voltage drop being sensed by control circuit 530 thus initiating a shutdown due to an under voltage condition.

In one preferred embodiment, control circuit 530 further comprises hysteresis to allow for inrush current to Hi-PD 250 without triggering an overload condition. In another preferred embodiment, Hi-PD 250 has low power functionality and full power functionality. In this embodiment, control circuit 530 signals Hi-PD 250 to be at low power mode, and control circuit 530 supplies power when only one of first and second DC/DC converters 520 is operating. It is to be understood that in this embodiment, Hi-PD 250 will receive low power and low voltage, which will typically only suffice for critical functionality.

Figure 3B:
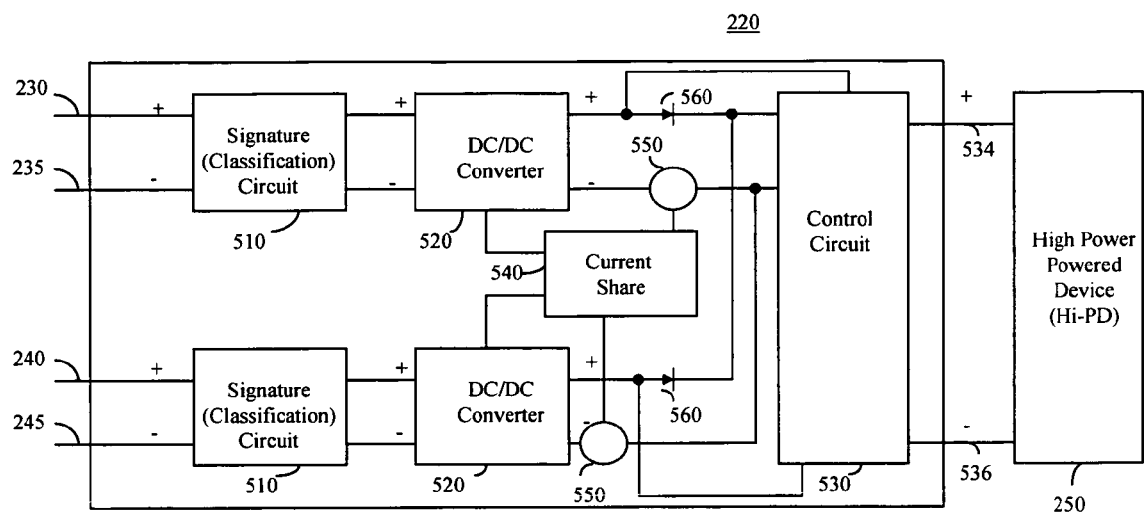
FIG. 3b illustrates a high level block diagram of a second embodiment of a power combiner according to the principle of the current invention.

FIG. 3b illustrates a high level block diagram of a second embodiment of a power combiner 220 according to the principle of the current invention comprising first power input having positive lead 230 and negative lead 235, second power input having positive lead 240 and negative lead 245, first and second signature circuits 510, first and second DC/DC converters 520, current share circuit 540, first and second current sensors 550, first and second diodes 560 and control circuit 530 having positive output 534 and negative output 536 shown connected to Hi-PD 250. First positive and negative power input leads 230, 235 respectively, are connected to the input of first signature circuit 510. Second positive and negative power input leads 240, 245 respectively, are connected to the input of second signature circuit 510. The positive and negative outputs of first signature circuit 510 are connected to the input of first DC/DC converter 520 and the positive and negative outputs of second signature circuit 510 are connected to the input of second DC/DC converter 520. First and second DC/DC converters 520 are effectively connected in parallel. The positive output of first DC/DC converter 520 is connected through first diode 560 to the positive power input of control circuit 530. The negative output of first DC/DC converter 520 is connected through first current sensor 550 to the negative power input of control circuit 530. The positive output of second DC/DC converter 520 is connected through second diode 560 to the positive power input of control circuit 530. The negative output of second DC/DC converter 520 is connected through second current sensor 550 to the negative power input of control circuit 530. The sense output of first current sensor 550 is connected to a first input of current share circuit 540, and the sense output of second current sensor 550 is connected to a second input of current share circuit 540.

A power sense lead is connected between the output of first DC/DC converter 520 and control circuit 530, and a power sense lead is connected between the output of second DC/DC converter 520 and control circuit 530. The control output of current share circuit 540 is fed as control inputs to first and second DC/DC converter 520. Positive output 534 and negative power output 536 of control circuit 530 represent the output of power combiner 220 and are connected to Hi-PD 250.

In operation, first and second signature circuit 510 function in all respects in the manner described above in relation to FIG. 3a and FIG. 4. First and second DC/DC converters 520 function to convert the DC power delivered from first and second PSE 40 of FIGS. 2a, 2d or first and second output of PSE 310 of FIGS. 2b, 2c to the required operating voltage of Hi-PD 250. In an exemplary embodiment, approximately 48 Volts appear between positive input 230 and negative input 235, approximately 48 Volts appear between positive input 240 and negative input 245 and Hi-PD 250 is preferably powered by 12V DC. Thus, in the exemplary embodiment, first and second DC/DC converters 520 are each 48V to 12V DC converters known to those skilled in the art. First and second DC/DC converters 520 are preferably of the isolated type, such as a flyback converter, in order to meet isolation needs between the inputs 230, 235 and 240, 245 respectively, and outputs 534, 536 of power combiner 220. Furthermore, isolated DC/DC converters 520 are advantageous when utilized in network configuration 200 of FIG. 2a and network configuration 400 of FIG. 2d wherein power is supplied by both first and second PSE 40 located in disparate equipment. Non-isolated topologies, such as a buck DC/DC converter, are advantageously simpler and thus lower in cost, and are preferably utilized when isolation is not required.

Current share circuit 540 functions in cooperation with first and second current sensors 550 to sense the difference in current supplied by first and second DC/DC converters 520 to control circuit 530 and ultimately to Hi-PD 250. In a preferred embodiment, first and second current sensors 550 are constituted of sense resistors. The sensed difference is then applied as feedback to first and second DC/DC converters 520 so as to maintain a near even balance between the current supplied by first and second DC/DC converters 520. In an exemplary embodiment the feedback provided by current share circuit 540 modifies a PWM or resonance controller in one or both of first and second DC/DC converters 520.

Control circuit 530 functions to ensure that Hi-PD 250 does not receive power from first and second DC/DC converters 520 until both DC/DC converters 520 have stabilized at their normal operating voltage. A further preferred function of control circuit 530 is to provide hot start current limiting, thus preventing an overload of either of first and second DC/DC converters 520 during the initial inrush current of Hi-PD 250. A further preferred function of control circuit 530 is to remove power from Hi-PD 250 in the event of a shut down of one of first and second DC/DC converters 520. It is to be understood that shut down of a DC/DC converter 520 may occur due to a failure of DC/DC converter 520, or due to a disconnect of power to the DC/DC converter 520 by PSE 40 of FIGS. 2a, 2d or PSE 310 of FIGS. 2b, 2c. A further preferred function of control circuit 530 is to protect power combiner 220 in the event of a short circuit condition across the output leads of power combiner 220. Preferably, control circuit 530 functions in the event of an over-current condition to disconnect the combined output of first and second DC/DC converters 520 for a pre-determined period of time. Optionally, in a manner that will be explained further below, after expiration of the pre-determined period of time, power is reconnected for a short trial period to test if the short circuit still exists. In another embodiment (not shown) control circuit 530 upon sensing an over-current condition shuts down the operation of first and second DC/DC converters 520.

In one preferred embodiment, control circuit 530 further functions during an overload caused by Hi-PD 250, to turn off power to Hi-PD 250. In a first exemplary embodiment this function is a result of the action of at least one PSE 40 of FIGS. 2a, 2d or at least one output of PSE 310 of FIGS.

2b, 2c, the overload condition having been passed through control circuit 530 to first and second DC/DC converters 520 to PSE 40 of FIGS. 2a, 2d or PSE 310 of FIGS. 2b, 2c. In a second exemplary embodiment this function is operative due to the voltage drop at the output of the combination of first and second DC/DC converters 520, and control circuit 530 senses an under voltage condition thus initiating a shutdown.

In one preferred embodiment, control circuit 530 further comprises hysteresis to allow for inrush current to Hi-PD 250 without triggering an overload condition. In another preferred embodiment, Hi-PD 250 has low power functionality and full power functionality. In this embodiment, control circuit 530 signals Hi-PD 250 to be at low power mode, and control circuit 530 supplies power when only one of first and second DC/DC converters 520 is operating. It is to be understood that in this embodiment, Hi-PD 250 will receive low power which will typically only suffice for critical functionality.

Figure 3C:
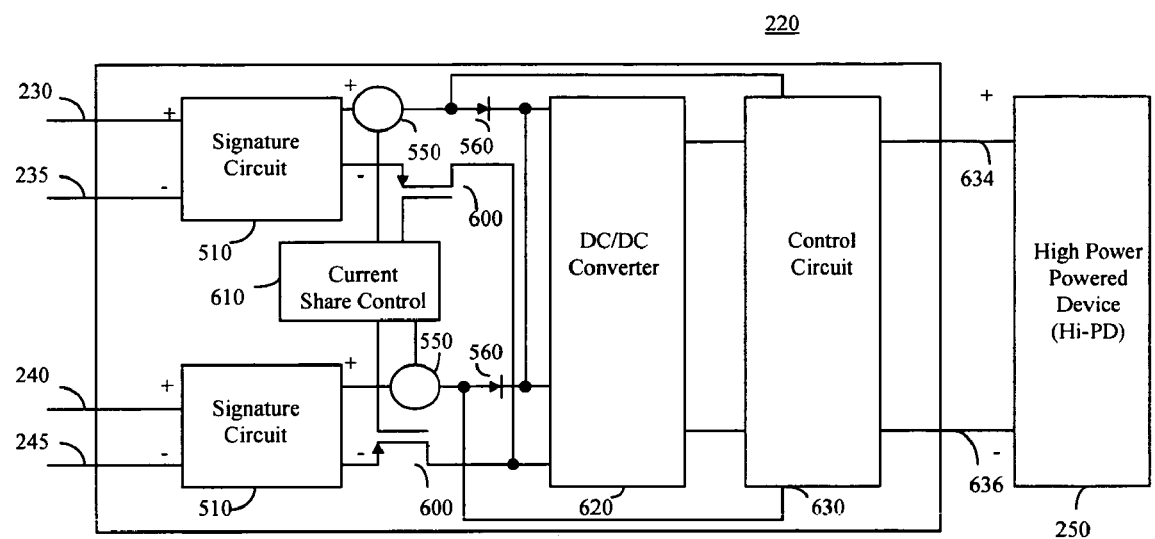
FIG. 3c illustrates a high level block diagram of a third embodiment of a power combiner according to the principle of the current invention.

FIG. 3c illustrates a high level block diagram of a third embodiment of a power combiner 220 according to the principle of the current invention comprising first power input having positive lead 230 and negative lead 235, second power input having positive lead 240 and negative lead 245, first and second signature circuits 510, first and second current sensors 550, first and second diodes 560, first and second power FET 600, current share circuit 610, DC/DC converter 620 and control circuit 630 having positive power output 634 and negative power output 636 shown connected to Hi-PD 250. First positive and negative power input leads 230, 235 respectively, are connected to the input of first signature circuit 510. Second positive and negative power input leads 240, 245 respectively, are connected to the input of second signature circuit 510. The positive power output of each of first and second signature circuit 510 is connected through first and second current sensor 550 and first and second diode 560, respectively, to the positive power input of DC converter 620. The negative power output of each of first and second signature circuit 510 is connected through first and second power FET 600, respectively to the negative power input of DC/DC converter 620. The sense output of each of first and second current sensor 550 is connected to a first and second sense input, respectively, of current share control 610. The output of each of first and second current sensor 550 are preferably further connected to a first and second sense input, respectively, of control circuit 630. A first control output of current share control 610 is connected to the gate input of first power FET 600 and a second control output of current share control 610 is connected to the gate input of second power FET 600. The positive and negative outputs of DC/DC converter 620 are connected to control circuit 630. Positive output 634 and negative output 636 of control circuit 630 represents the output of power combiner 220 and are connected to Hi-PD 250.

In operation, first and second signature circuit 510 function in all respects in the manner described above in relation to FIG. 3a and FIG. 4. It is to be noted that the embodiment of FIG. 3c presents a common ground between first and second power inputs, and thus the architecture of FIGS. 2a and 2d, in which power is supplied from disparate modules is discouraged.

Current share control 610 operates in cooperation with first and second current sensors 550 to balance the current flow through first and second power FET 600. In a preferred embodiment, first and second current sensors 550 comprise sense resistors. DC/DC converter 620 functions to convert the DC power delivered from first and second output of PSE 310 of FIGS. 2b, 2c to the required operating voltage of Hi-PD 250. In an exemplary embodiment, approximately 48 Volts appear between positive input 230 and negative input 235, approximately 48 Volts appear between positive input 240 and negative input 245 and Hi-PD 250 is preferably powered by 12V DC. Thus, in the exemplary embodiment, DC/DC converter 620 is a 48V to 12V DC converter known to those skilled in the art.

Control circuit 630 functions to ensure that Hi-PD 250 does not receive power from DC/DC converter 620 until voltage is sensed at the output of each of first and second current sensors 550. A further preferred function of control circuit 630 is to provide hot start current limiting, thus preventing an overload DC/DC converters 620 during the initial inrush current of Hi-PD 250. A further preferred function of control circuit 630 is to remove power from Hi-PD 250 in the event of a disconnect of power to DC/DC converter 620 by one output of PSE 310 of FIGS. 2b, 2c. A further preferred function of control circuit 530 is to protect power combiner 220 in the event of a short circuit condition across the output leads of power combiner 220. Preferably, control circuit 530 functions to disconnect the output of DC/DC converters 620 for a pre-determined period of time. Optionally, in a manner that will be explained further below, after expiration of the pre-determined period of time, power is reconnected for a short trial period to test if the short circuit still exists.

In one preferred embodiment, control circuit 630 further functions during an overload caused by Hi-PD 250, to turn off power to Hi-PD 250. In a first exemplary embodiment this function is a result of the action of at least one output of PSE 310 of FIGS. 2b, 2c, the overload condition having been passed through control circuit 630 to DC/DC converters 620 to PSE 310 of FIGS. 2b, 2c. In a second exemplary embodiment this function is operative due to the voltage drop at the output of DC/DC converter 620, and control circuit 530 senses an under voltage condition thus initiating a shutdown.

In one preferred embodiment, control circuit 630 further comprises hysteresis to allow for inrush current to Hi-PD 250 without triggering an overload condition. In another preferred embodiment, Hi-PD 250 has low power functionality and full power functionality. In this embodiment, control circuit 630 signals Hi-PD 250 to be at low power mode, and control circuit 630 supplies low power when sufficient voltage is detected at the output of only one of first and second current sensors 550 in a manner that we explained further hereinto below. It is to be understood that in this embodiment, Hi-PD 250 will receive low power and low voltage, which will typically only suffice for critical functionality.

Figure 3D:
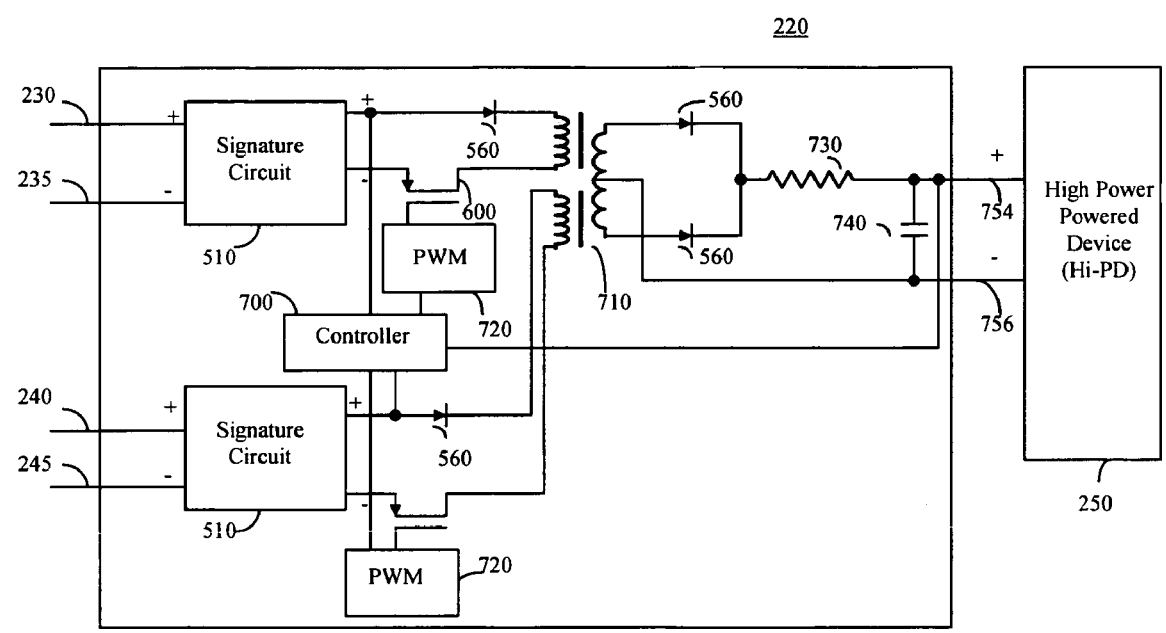
FIG. 3d illustrates a high level block diagram of a fourth embodiment of a power combiner according to the principle of the current invention.

FIG. 3d illustrates a high level block diagram of a fourth embodiment of a power combiner 220 according to the principle of the current invention comprising: first power input having positive lead 230 and negative lead 235; second power input having positive lead 240 and negative lead 245; first and second signature circuits 510; first, second, third and fourth diodes 560; first and second power FET 600; controller 700; transformer 710 having first and second primaries and a single center tapped secondary; first and second PWM/resonance controller 720; resistor 730 and capacitor 740 having positive power output 754 and negative power output 756 shown connected to Hi-PD 250.

First positive and negative power input leads 230, 235 respectively, are connected to the input of first signature circuit 510. Second positive and negative power input leads 240, 245 respectively, are connected to the input of second signature circuit 510. The positive power outputs of first and second signature circuit 510 are each respectively connected through first and second diode 560 to one end of the first and second primaries of transformer 710. The positive power outputs of first and second signature circuit 510 are respectively further connected to sense inputs of controller 700. The negative power outputs of first and second signature circuits 510 are each respectively connected through power FET 600 to the second end of the first and second primaries of transformer 710. The gates of first and second power FET 600 are respectively connected to the output of first and second PWM/resonance controller 720. First and second PWM/resonance controllers 720 are respectively connected to outputs of controller 700.

The first and second ends of the secondary of transformer 710 are respectively connected through third and fourth diode 560 to a first end of resistor 730. The second end of resistor 730 is connected as a feedback to controller 700, to one end of capacitor 740 and serves as positive output 754 of combiner 220. The center tap of the secondary of transformer 710 is connected to the second end of capacitor 740 and serves as negative output 756 of combiner 220.

In operation, first and second signature circuit 510 function in all respects in the manner described above in relation to FIG. 3a and FIG. 4. It is to be noted that the embodiment of FIG. 3d presents a common ground between first and second power inputs, and thus the architecture of FIGS. 2a and 2d, in which power is supplied from disparate modules is discouraged. However, similar isolated configurations suitable for use with the architectures of FIGS. 2a and 2d are known to those skilled in the art and do not exceed the scope of the invention. In particular it is to noted that isolation allowing for different grounds between the input and output can be accomplished utilizing isolating elements in the voltage and current feedback connection.

Controller 700 operates in cooperation with first and second sense points of the power output of first and second signature circuits 510, and the current and voltage feedback connection to balance the current flow through first and second power FET 600. Controller 700 further operates to control the timing of at least one of first and second PWM/resonance controller 720 so as to jointly power the attached load.

Optionally (not shown) a control circuit similar to control circuit 630 of FIG. 3c may be placed at the output of the circuitry of FIG. 3d to supply added functionality. Preferably, the control circuit is further connected to controller 700 to operatively control first and second PWM/resonance controllers 720.

Figure 3E:
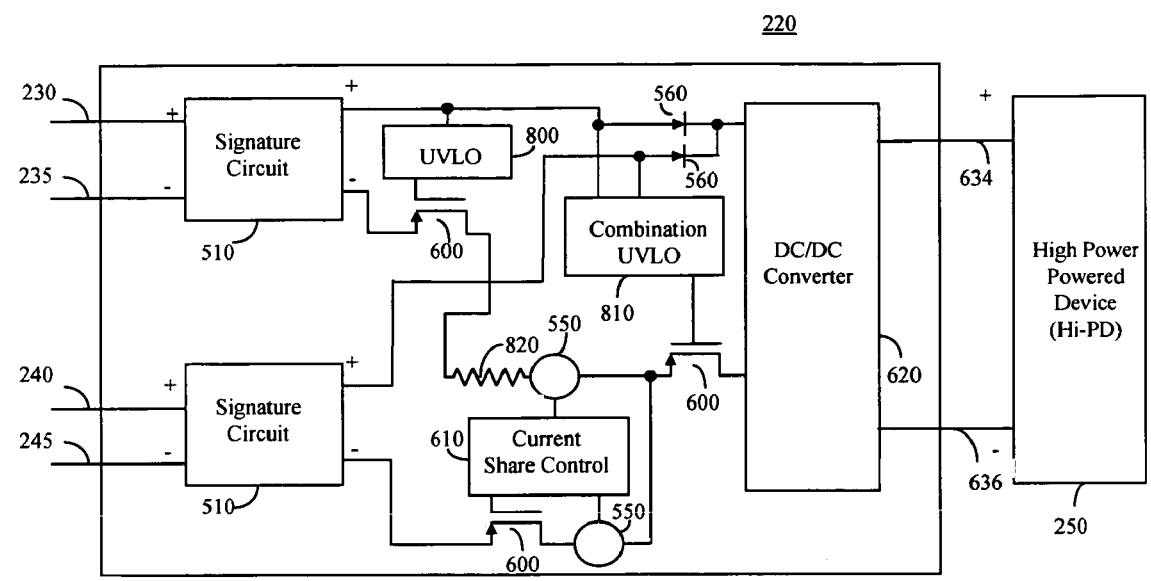
FIG. 3e illustrates a high level block diagram of a fifth embodiment of a power combiner according to the principle of the current invention.

FIG. 3e illustrates a high level block diagram of a fifth embodiment of a power combiner 220 according to the principle of the current invention comprising first power input having positive lead 230 and negative lead 235; second power input having positive lead 240 and negative lead 245; first and second signature circuits 510; first and second current sensors 550; first and second diodes 560; first, second and third power FETs 600; current share control 610; under-voltage lock out and isolation circuit (UVLO) 800; combination UVLO 810; unbalancing resistor 820; DC/DC converter 620 having positive power output 634 and negative power output 636 shown connected to Hi-PD 250. Positive and negative power input leads 230, 235 are respectively connected to the input of first signature circuit 510. Positive and negative power input leads 240, 245 are respectively connected to the input of second signature circuit 510. The positive power output of first signature circuit 510 is connected through first diode 560 to the positive power input of DC converter 620. The voltage sensing input of UVLO 800 and a first sensing input of combination UVLO 810 are each connected to the positive power output of first signature circuit 510. The positive power output of second signature circuit 510 is connected through second diode 560 to the positive power input of DC converter 620. A second sensing input of combination UVLO 810 is connected to the positive power output of second signature circuit 510.

The return from DC converter 620 is connected through second power FET 600 to both first and second current sensors 550. The sense outputs of each of first and second current sensors 550 are connected as inputs to current share control 610. The output of first current sensor 550 is connected through unbalancing resistor 820 and through first power FET 600 to the negative power output of first signature circuit 510. The gate of first power FET 600 is connected to the control output of UVLO 800. The output of second current sensor 550 is connected through third power FET 600 to the negative power output of second signature circuit 510. The gate of second power FET 600 is connected to the output of combination UVLO 810 and the gate of third power FET 600 is connected to the output of current share control 610.

In operation, first and second signature circuit 510 each function in all respects in the manner described above in relation to FIG. 3a and FIG. 4, thereby providing detection and optional classification functionality. It is to be noted that the embodiment of FIG. 3e presents a common ground between first and second power inputs, and thus the architecture of FIGS. 2a and 2d, in which power is supplied from disparate modules, is discouraged.

UVLO 800 senses operating voltage from the first power input connected via first signature circuit 510 and operates first power FET 600 to allow current flow. Combination UVLO 810 senses operating voltage from both the first power input connected to first signature circuit 510 and the second power input connected to second signature circuit 510. In response to the two sensed operating voltages, combination UVLO 810 operates second power FET 600 to allow current flow. DC/DC converter 620 therefore begins to operate. Current returning to first signature circuit 510 and second signature circuit 510 are sensed by respective first and second current sensors 550. In an exemplary embodiment current sensors 550 each comprise low value resistors on the order of 0.1-2 ohms. Current share control circuit 610 operates third power FET 600 as a voltage regulator controlling the current returning to second signature circuit 510. In an exemplary embodiment current flowing via each of first and second signature circuits 510 is therefore controlled to be substantially equal. Current share control circuit 610 further provides isolation and under voltage lockout functionality.

Unbalancing resistor 820 is operative to pre-determine which of the first power input connected by way of first signature circuit 510 and second power input connected by way of second signature circuit 510 presents a lower voltage. In the event that it is pre-determined that one path proceeds via transformers 50 as shown in FIGS. 2b and 2c, unbalancing resistor 820 may not be required as the unbalancing functionality is provided by the windings of the respective transformers 50. In particular, data transformers 50 in the data path preferably ensure a lower voltage than power via the spare pair path. Unbalancing resistor 820 is preferably included in combiners 220 operative for 1000 Base T installations, in which data is transferred on all pairs. In an exemplary embodiment in which current sensors 550 comprise low value resistors as described above, unbalancing resistor 820 may be incorporated into the value of one of the current sensing resistors 550.

It is to be understood that in the event power associated with first signature circuit 510 is controlled to be synchronized with power associated with second signature circuit 510, diodes 560 which function as current sharing diodes, may be eliminated. Furthermore, in one embodiment combination UVLO 810 and second power FET 600 may be further eliminated by the proper synchronization of supplied power.

DC/DC converter 620 functions to convert the DC power delivered from first and second output of PSE 310 of FIGS. 2b, 2c to the required operating voltage of Hi-PD 250. In an exemplary embodiment, approximately 48 Volts appear between positive input 230 and negative input 235, approximately 48 Volts appear between positive input 240 and negative input 245 and Hi-PD 250 is preferably powered by 12V DC. Thus, in the exemplary embodiment, DC/DC converter 620 is a 48V to 12V DC converter known to those skilled in the art. Combination UVLO 810 functions to ensure that DC/DC converter 620 does not receive power until voltage is sensed at the output of each of first and second signature circuits 510.

It is to be understood that power combiner 220 of FIGS. 3a-3e are in an exemplary embodiment co-located within Hi-PD 250. It is also to be understood that power combiner 220 of each of FIGS. 3a-3d is suitable for indoor or outdoor usage, provided the appropriate lightning and surge protection mechanisms, known to those skilled in the art, are provided.

Hi-PD 250 is an exemplary embodiment an IP camera having pan, tilt and zoom capabilities. As indicated above, such an IP camera is available for indoor or outdoor usage. In another exemplary embodiment, Hi-PD 250 is a cellular base station. In another embodiment Hi-PD 250 is a wireless access point, laptop computer, desk top computer or an entrance control.

Figure 5A:
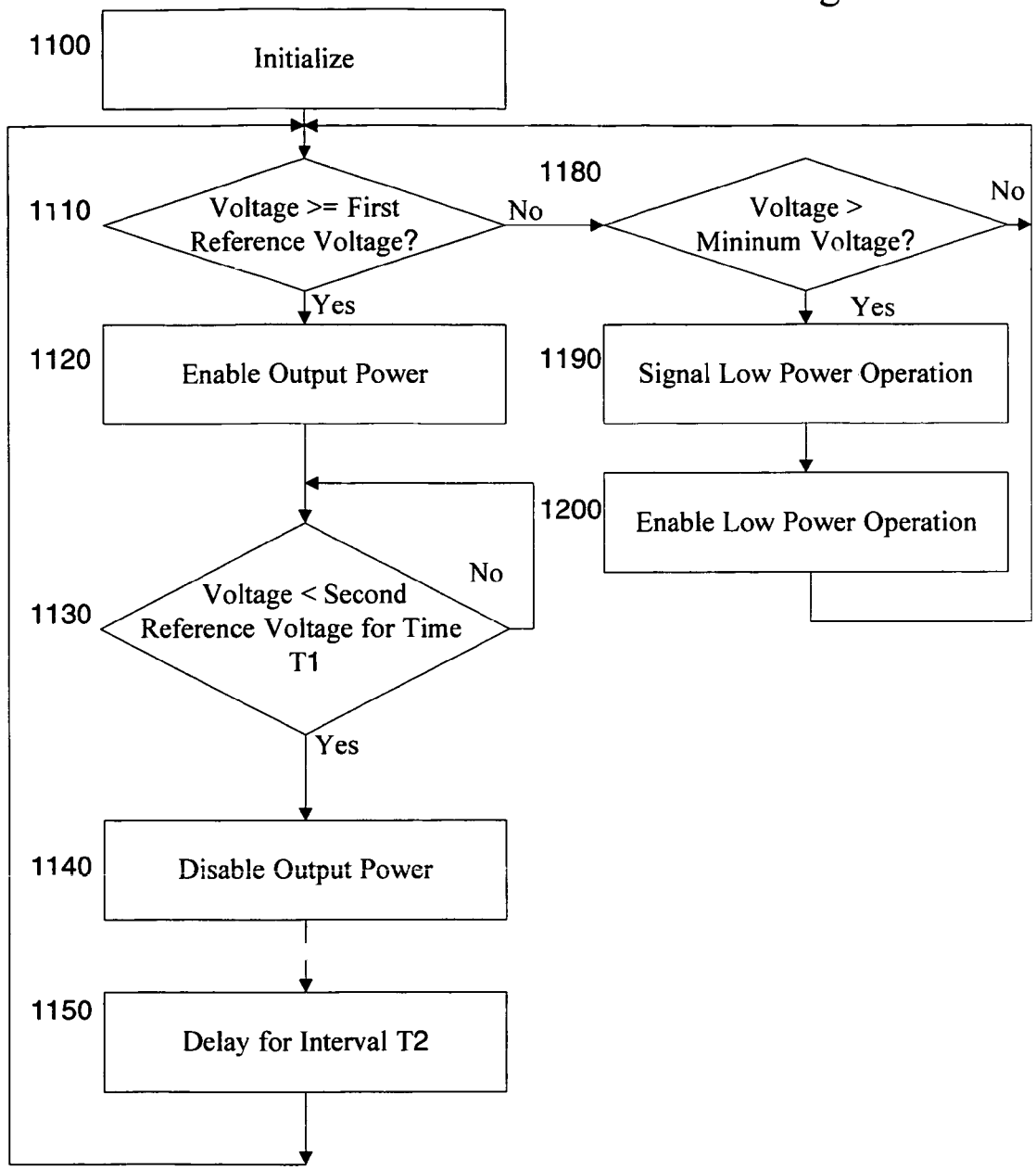

FIG. 5a illustrates a high level flow chart of the operation of control circuit 530 of FIG. 3a. In stage 1100, initialization is accomplished, and first, second and minimum reference voltages are loaded. In stage 1110, the input voltage is compared to the first reference voltage loaded in stage 1100. In the event that the input voltage is equal to or greater than the first reference voltage, in stage 1120 output power is enabled. In stage 1130, the input voltage is compared to the second reference voltage loaded in stage 1100. In a preferred embodiment the second reference voltage is lower than the first reference voltage thus providing hysteresis and enabling inrush current in excess of steady state current without shutting down output power. In the event that in stage 1130 the input voltage is not less than the second reference voltage for a first interval, denoted T1, stage 1130 is repeated. Interval T1 is used to prevent transients from shutting down the output power.

In the event that in stage 1130 the input voltage is less than the second reference voltage for interval T1, in stage 1140 output power is disabled. In stage 1150 a second interval, denoted T2, is delayed, and after expiration of T2, in stage 1110 the voltage is compared to the first reference voltage. In a preferred embodiment, the interval T2 is significantly longer than T1 thus allowing only a low duty cycle in the event of a short circuit.

In the event that in stage 1110 the voltage was less than the first reference voltage, in stage 1180 the voltage is compared to the minimum reference voltage loaded in stage 1100. In the event that the voltage is not greater than the minimum reference voltage, stage 1110 is repeated. In the event that in stage 1180 the voltage is above the minimum reference voltage, in stage 1190 low power operation is signaled. In stage 1200, low power operation is enabled based on the minimum reference voltage sensed in stage 1180. Following stage 1200, stage 1110 is repeated.

Figure 5B:
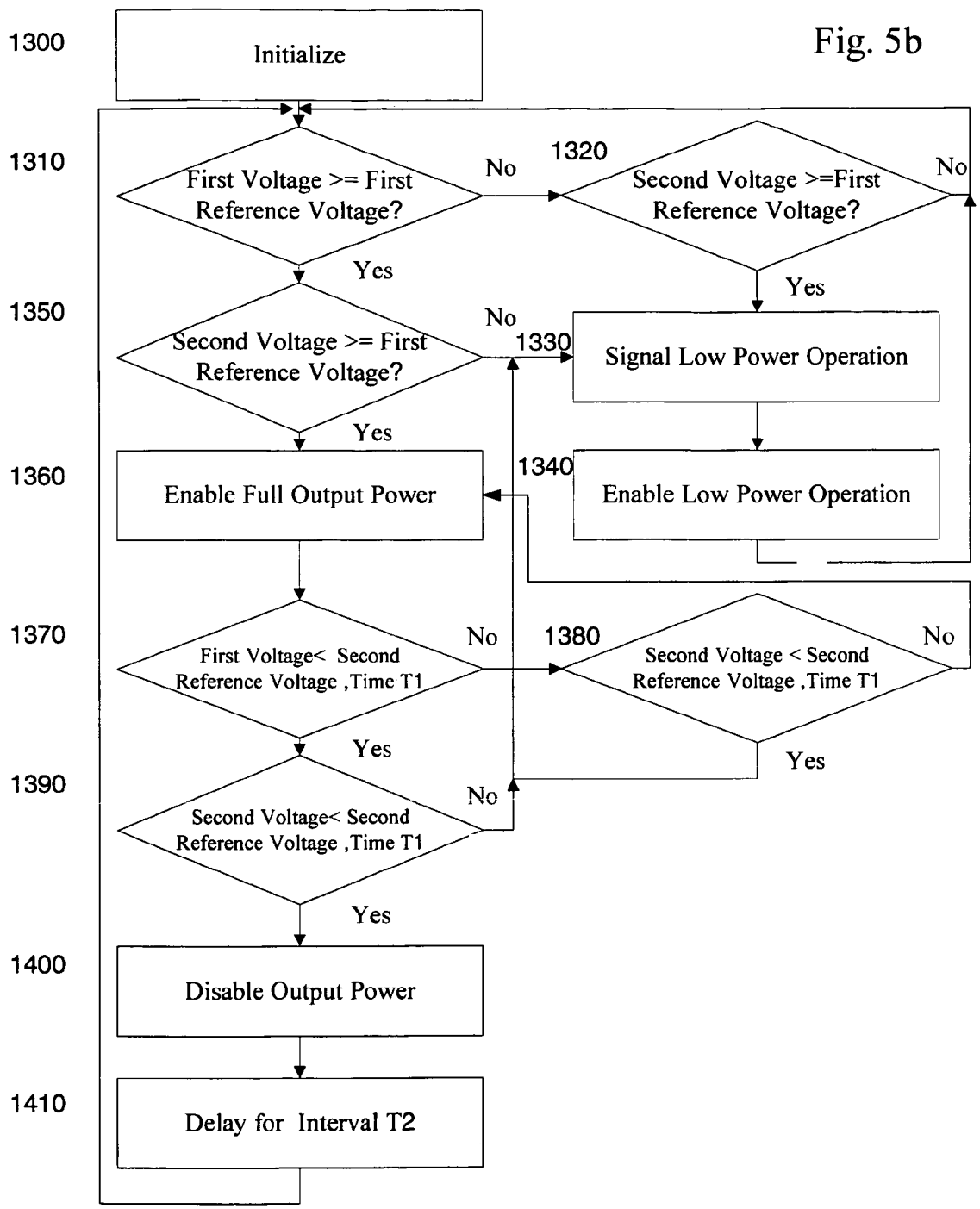
FIG. 5b illustrates a high level flow chart of a preferred operation of control circuit of FIGS. 3b-3c.

FIG. 5b illustrates a high level flow chart of the operation of control circuit 530 of FIG. 3b and control circuit 630 of FIG. 3c. In stage 1300, initialization is accomplished, and first and second reference voltages are loaded. In stage 1310, the first input voltage is compared to the first reference voltage loaded in stage 1300. In the event that the first input voltage is not greater than or equal to the first reference voltage, in stage 1320 the second input voltage is compared to the first reference voltage. In the event that in stage 1320 the second input voltage is equal to or greater than the first reference voltage, in stage 1330 low power operation is signaled. In stage 1340 low power operation is enabled based on the second voltage compared in stage 1320. Following stage 1340, stage 1310 is repeated.

In the event that in stage 1320 the second input voltage is not greater than or equal to the first reference voltage, stage 1310 is repeated as both the first and second input voltages are insufficient to support low power operation.

In the event that in stage 1310 the first input voltage is greater than or equal to the first reference voltage, in stage 1350 the second input voltage is compared to the first reference voltage. In the event that the second input voltage is not greater than or equal to the first reference voltage, in stage 1330 low power is signaled as a result of having a first input voltage above the first reference and the second input voltage below the first reference.

In the event that in stage 1350, the second input voltage is greater than or equal to the first reference voltage in stage 1360 full output power is enabled.

In stage 1370 the first input voltage is compared to the second reference voltage loaded in stage 1300. In a preferred embodiment the second reference voltage is lower than the first reference voltage thus providing hysteresis and enabling inrush current in excess of steady state current without shutting down output power. In the event that in stage 1370 the first input voltage is not less than the second reference voltage for a first interval, denoted T1, in stage 1380 the second input voltage is compared to the second reference voltage. In the event that the second input voltage is not less than the second reference voltage for interval T1, in stage 1360 full power is confirmed as enabled. In the event that in stage 1380 the second input voltage is less than the second reference voltage for interval T1, indicating a failure of the second input voltage, in stage 1330 low power operation is signaled. Thus, in the circumstance in which the first input voltage has been compared and found to be greater than or equal to the second reference voltage in stage 1370, and the second input voltage has been compared and found to be below the second reference voltage in stage 1380, low power operation is signaled in stage 1330 and enabled in stage 1340.

In the event that in stage 1370 the first input voltage is less than the second reference voltage for interval T1, in stage 1390 the second input voltage is compared to the second reference voltage. In the event that the second input voltage is not less than the second reference voltage for interval T1, in stage 1330 low power operation is signaled. Thus, in the circumstance in which the first input voltage has been compared and found to be less than the second reference voltage in stage 1370, and the second input voltage has been compared and found to be greater than or equal to the second reference voltage in stage 1390, low power operation is signaled in stage 1330 and enabled in stage 1340.

In the event that in stage 1390, the second input voltage is less than the second reference voltage for interval T1, in stage 1400 output power is disabled as a result of both the first and second input voltages falling below the second reference. This may be caused by an over-current condition such as a short circuit or a failed Hi-PD 250. In stage 1410 a second interval, denoted T2 is delayed, and after expiration of interval T2, in stage 1310 the first input voltage is compared to the first reference voltage as above. In a preferred embodiment, interval of stage 1410 is significantly longer than interval T1 thus allowing only a low duty cycle in the event of a short circuit.

Figure 6A:
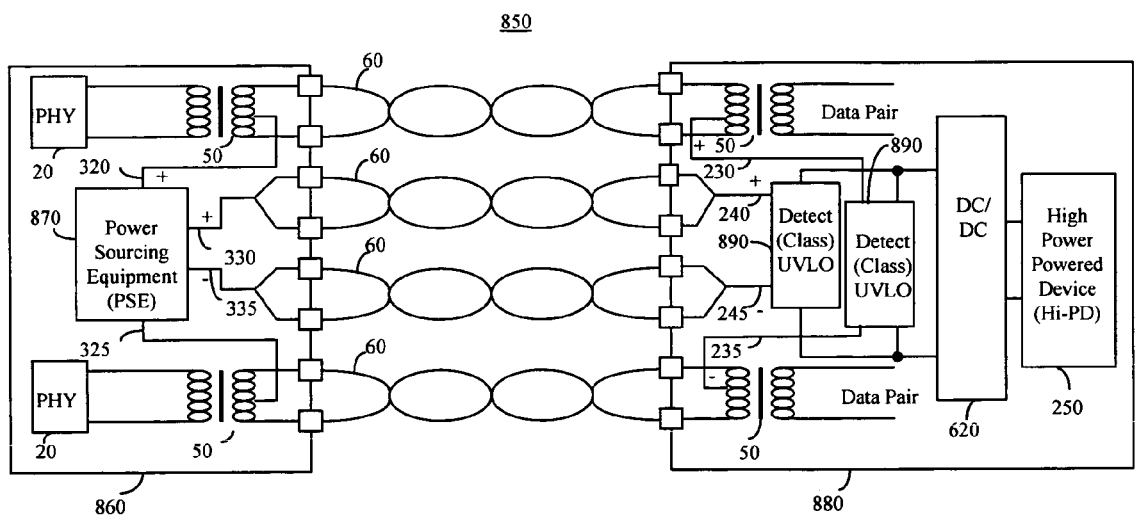
FIG. 6a illustrates a high level block diagram of multiple path power feeding in combination with endpoint PSE controlled power sharing according to the principle of the current invention.

FIG. 6a illustrates a high level block diagram of multiple path power feeding in combination with endpoint PSE controlled power sharing, herein designated network configuration 850, according to the principle of the invention. Network configuration 850 comprises high power switch/hub equipment 860 comprising first and second PHY 20, first and second transformers 50 and PSE 870 having a first power output constituted of positive power output lead 320 and negative power output lead 325, a second power output constituted of positive power output lead 330 and negative power output lead 335. Network configuration 850 further comprises first through fourth twisted pair connections 60; and high powered end station 880 comprising third and fourth transformers 50; first detection/classification/UVLO functionality 890 having positive power input 230 and negative power input 235; second detection/classification/ UVLO functionality 890 having positive power input 240 and negative power input 245; DC/DC converter 620 and Hi-PD 250. Each of first and second detection/classification/ UVLO functionality 890 preferably complies with the above mentioned IEEE 802.3af standard, and provides detection functionality, optional classification functionality, isolation and enablement of power to DC/DC converter 620 upon detection of an appropriate input voltage.

The primary of first and second transformers 50 are each connected to communication devices typically through first and second PHY 20, respectively. The output leads of the secondary of first and second transformers 50 are respectively connected to a first end of first and second twisted pair connections 60. The center tap of the secondary of first and second transformers 50 are respectively connected to positive output 320 and negative output 325 of PSE 870. The second end of first and second twisted pair connections 60 are respectively connected to the primary of third and fourth transformer 50 located within high powered end station 880. A first end of both leads of each of third and fourth twisted pair connections 60, respectively, are connected to positive output 330 and negative output 335 of PSE 870.

The center tap of the primary of third and fourth transformers 50 are respectively connected to positive power input 230 and negative power input 235 of first detection/ classification/UVLO functionality 890. A second end of both leads of third and fourth twisted pair connections 60 are respectively connected to positive power input 240 and negative power input 245 of second detection/classification/ UVLO functionality 890. The outputs of each of first and second detection/classification/UVLO functionality 890 are connected to DC/DC converter 620, and the output of DC/DC converter 620 is connected to Hi-PD 250. In one embodiment current sharing diodes are further supplied between a respective output of each of first and second detection/classification/UVLO functionality 890 and an input of DC/DC converter 620. In another embodiment, power is supplied substantially simultaneously through both first and second detection/classification/UVLO functionality 890 by the operation of PSE 870 as will be described further hereinto below and thus current sharing diodes are not required.

In operation, the first output of PSE 870 located in high power switch/hub 860, constituted of positive output 320 and negative output 325, supplies power to high powered end station 880 over first and second twisted pair connections 60, simultaneously with data being transmitted over first and second twisted pair connection 60. The second output of PSE 870 located in high power switch/hub 860, constituted of positive output 330 and negative output 335, supplies power to high powered end station 880 over third and fourth twisted pair connections 60. In a first embodiment first and second PSE 870 power outputs are isolated from each other. In a second embodiment first and second PSE 870 power outputs are non-isolated from each other. In another exemplary embodiment, first and second PSE 870 power outputs are derived from a single output of a single power source.

First and second detection/classification/UVLO functionality 890 function to independently present an appropriate signature resistance, and optionally classification, to respective first and second power outputs of PSE 870. Preferably this detection and optional classification is accomplished in accordance with the applicable IEEE 802.3af standard. It is to be noted that PSE 870, upon detection and classification on both first and second outputs, is thus notified that high powered end station 880 is operable to draw power from both ports. Upon sensing an appropriate operating voltage, first and second detection/classification/UVLO functionality 890 each function to independently supply power to DC/DC converter 620. DC/DC converter thus receives a combination of power from two sources, and is thus operable to supply high power to Hi-PD 250. PSE 870 is operable, as will be explained further hereinto below, to ensure appropriate power sharing between power being provided via first and second detection/classification/UVLO functionality 890.

Figure 6B:
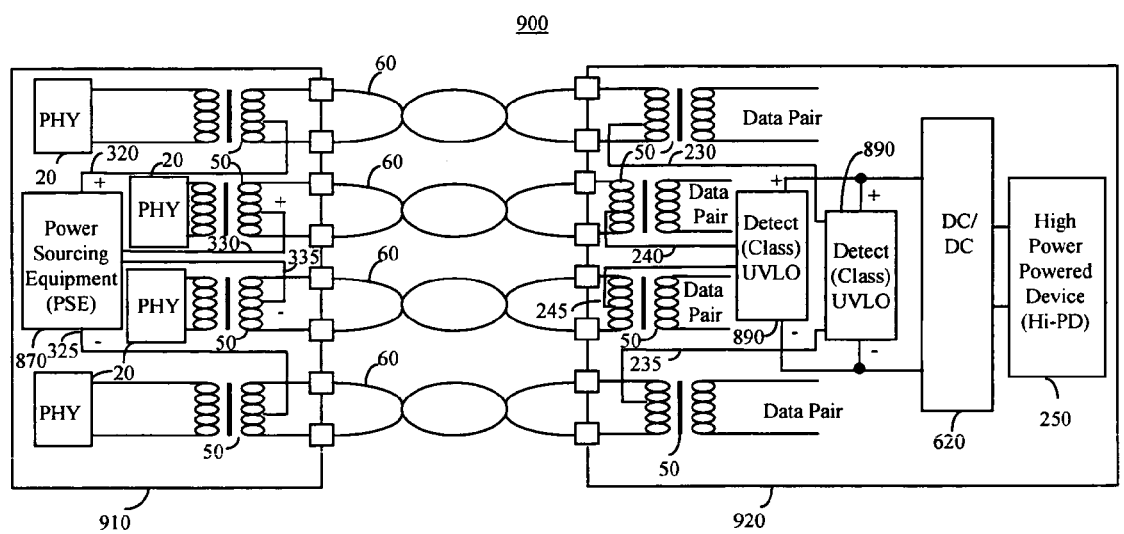
FIG. 6b illustrates a high level block diagram of multiple path power feeding in combination with endpoint PSE controlled power sharing, in which all pairs are used for data transmission, according to the principle of the current invention.

FIG. 6b illustrates a high level block diagram of multiple path power feeding in combination with endpoint PSE controlled power sharing in which all pairs are used for data transmission, herein designated network configuration 900, according to the principle of the invention. Network configuration 900 comprises: high power switch/hub equipment 910 comprising: first, second third and fourth PHY 20; first, second, third and fourth transformers 50; and PSE 870 having a first power output constituted of positive power output lead 320 and negative power output lead 325, and a second power output constituted of positive power output lead 330 and negative power output lead 335. Network configuration 900 further comprises high powered end station 920 comprising fifth, sixth, seventh and eighth transformers 50; first detection/classification/UVLO functionality 890 having positive power input 230 and negative power input 235; second detection/classification/UVLO functionality 890 having positive power input 240 and negative power input 245; DC/DC converter 620 and Hi-PD 250. Network configuration 900 also comprises first, second, third and fourth twisted pair connections 60. First and second detection/classification/UVLO functionality 890 preferably complies with the above mentioned IEEE 802.3af standard, and each provide detection functionality, optional classification functionality, isolation and enablement of power to DC/DC converter 620 upon detection of an appropriate input voltage and disablement of power to the PD power supply upon detection of an inappropriately low input voltage.

The primary of first through fourth transformers 50 are each connected to communication devices typically through first through fourth PHY 20, respectively. The output leads of the secondary of first and second transformers 50 are respectively connected to a first end of first and second twisted pair connections 60. The center tap of the secondary of first and second transformers 50 are respectively connected to positive output 320 and negative output 325 of PSE 870. The second end of first and second twisted pair connections 60 are respectively connected to the primary of fifth and sixth transformer 50 located within high powered end station 920. The output leads of the secondary of third and fourth transformers 50 are respectively connected to a first end of third and fourth twisted pair connections 60. The center tap of the secondary of third and fourth transformers 50 are respectively connected to positive output 330 and negative output 335 of PSE 870. The second end of third and fourth twisted pair connections 60 are respectively connected to the primary of seventh and eighth transformer 50 located within high powered end station 920.

The center tap of the primary of fifth and sixth transformers 50 are respectively connected to positive power input 230 and negative power input 235 of first detection/classification/UVLO functionality 890. The center tap of the primary of seventh and eighth transformers 50 are respectively connected to positive power input 240 and negative power input 245 of second detection/classification/UVLO functionality 890. The outputs of each of first and second detection/classification/UVLO functionality 890 are connected to DC/DC converter 620, and the output of DC/DC converter 620 is connected to Hi-PD 250. In one embodiment current sharing diodes are further supplied between a respective output of each of first and second detection/classification/UVLO functionality 890 and an input of DC/DC converter 620. In another embodiment, power is supplied substantially simultaneously through both first and second detection/classification/UVLO functionality 890 by the operation of PSE 870 as will be described further hereinto below and thus current sharing diodes are not required. The secondary of each of fifth through eighth transformers 50 are associated with data pairs.

In operation, the first output of PSE 870 located in high power switch/hub 910, constituted of positive output 320 and negative output 325, supplies power to high powered end station 920 over first and second twisted pair connections 60, simultaneously with data being transmitted over first and second twisted pair connection 60. The second output of PSE 870 located in high power switch/hub 910, constituted of positive output 330 and negative output 335, supplies power to high powered end station 920 over third and fourth twisted pair connections 60, simultaneously with data being transmitted over third and fourth twisted pair connection. 60. In a first embodiment first and second outputs of PSE 870 are isolated from each other. In a second embodiment first and second outputs of PSE 870 are non-isolated from each other. In another exemplary embodiment, first and second outputs of PSE 870 are derived from a single output of a single power source.

First and second detection/classification/UVLO functionality 890 function to independently present an appropriate signature resistance, and optionally classification, to respective first and second power outputs of PSE 870. Preferably this detection and optional classification is accomplished in accordance with the applicable IEEE 802.3af standard. It is to be noted that PSE 870, upon detection and classification on both first and second outputs, is thus notified that high powered end station 920 is operable to draw power from both ports. Upon sensing an appropriate operating voltage first and second detection/classification/UVLO functionality 890 each function to independently supply power to DC/DC converter 620. DC/DC converter thus receives a combination of power from two sources, and is thus operable to supply high power to Hi-PD 250. PSE 870 is operable, as will be explained further hereinto below, to ensure appropriate power sharing between power being provided via first and second detector/classification/UVLO functionality 890.

Figure 6C:
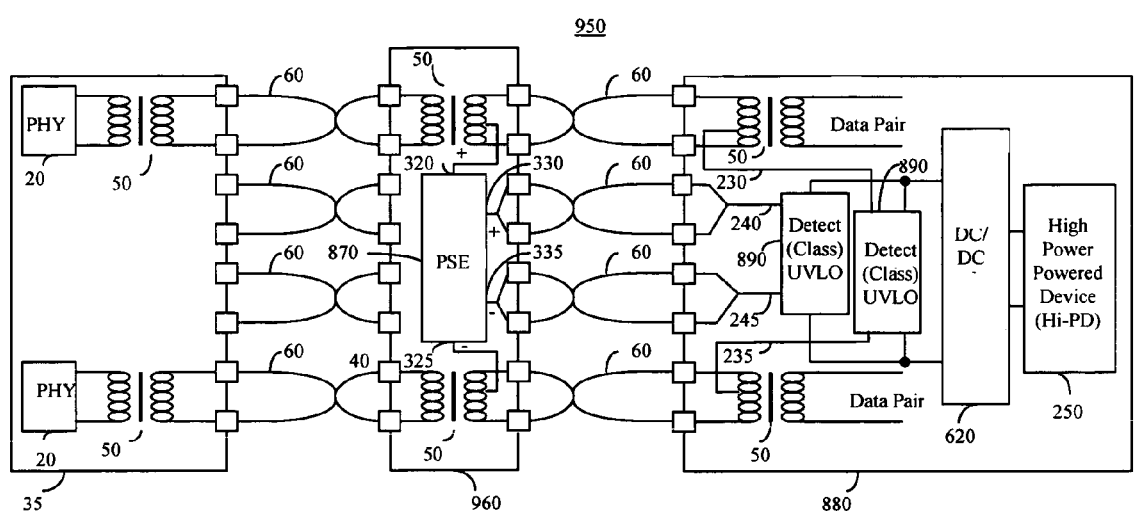
FIG. 6c illustrates a high level block diagram of multiple path power feeding in combination with midspan PSE controlled power sharing according to the principle of the current invention.

FIG. 6c illustrates a high level block diagram of multiple path power feeding in combination with midspan PSE controlled power sharing, herein designated network configuration 950, according to the principle of the current invention. Network configuration 950 comprises: switch/hub equipment 35 comprising first and second PHY 20 and first and second transformers 50; first through eighth twisted pair connections 60; high power midspan power insertion equipment 960 comprising third and fourth transformers 50 and PSE 870 having a first power output constituted of positive power output lead 320 and negative power output lead 325, and further having a second power output constituted of positive power output lead 330 and negative power output lead 335. Network configuration 950 further comprises high powered end station 880 comprising fifth and sixth transformers 50; first detection/classification/UVLO functionality 890 having positive power input 230 and negative power input 235; second detection/classification/UVLO functionality 890 having positive power input 240 and negative power input 245; DC/DC converter 620 and Hi-PD 250. Each of first and second detection/classification/UVLO functionality 890 preferably complies with the above mentioned IEEE 802.3af standard, and provides detection functionality, optional classification functionality, isolation and enablement of power towards DC/DC converter 620 upon detection of an appropriate input voltage.

The primary of first and second transformers 50 are each connected to communication devices typically through first and second PHY 20, respectively. The output leads of the secondary of first and second transformers 50 are respectively connected to a first end of first and second twisted pair connections 60. The second end of each of first and second twisted pair connections 60 are connected to the primary of third and fourth transformer 50, respectively, located within high power midspan power insertion equipment 960. Third and fourth twisted pair connections 60 are connected between switch/hub 35 and high power midspan power insertion equipment 960, however no internal connection is made to either third or fourth twisted pair connection 60.

The center taps of the secondary of third and fourth transformers 50 are connected, respectively, to positive output 320 and negative output 325 of PSE 870. A first end of each of fifth and sixth twisted pair connections 60, respectively, is connected to the secondary of third and fourth transformers 50. A second end of each of fifth and sixth twisted pair connections, respectively, is connected to the primary of fifth and sixth transformers 50, located in high powered end station 880. Both leads of a first end of each of seventh and eighth twisted pair connections 60, respectively, are connected to positive output 330 and negative output 335 of midspan PSE 870.

The center tap of the primary of fifth and sixth transformers 50 are respectively connected to positive power input 230 and negative power input 235 of first detection/classification/UVLO functionality 890. A second end of both leads of third and fourth twisted pair connections 60 are respectively connected to positive power input 240 and negative power input 245 of second detection/classification/UVLO functionality 890. The outputs of each of first and second detection/classification/UVLO functionality 890 are connected to DC/DC converter 620, and the output of DC/DC converter 620 is connected to Hi-PD 250. In one embodiment current sharing diodes are further supplied between a respective output of each of first and second detection/classification/UVLO functionality 890 and an input of DC/DC converter 620. In another embodiment, power is supplied substantially simultaneously through both first and second detection/classification/UVLO functionality 890 by the operation of PSE 870 as will be described further hereinto below and thus current sharing diodes are not required.

In operation, the first output of PSE 870 located in high power midspan 960, constituted of positive output 320 and negative output 325, supplies power to high powered end station 880 over fifth and sixth twisted pair connections 60, simultaneously with data, the data being transmitted over first and second twisted pair connections 60 via third and fourth transformers 50 onto fifth and sixth twisted pair connections 60. The second output of PSE 870 located in high power midspan 960, constituted of positive output 330 and negative output 335, supplies power to high powered end station 880 over seventh and eighth twisted pair connections 60.

First and second detection/classification/UVLO functionality 890 function to independently present an appropriate signature resistance, and optionally classification, to respective first and second power outputs of PSE 870. Preferably this detection and optional classification is accomplished in accordance with the applicable IEEE 802.3af standard. It is to be noted that PSE 870, upon detection and classification on both first and second outputs, is thus notified that high powered end station 880 is operable to draw power from both ports. Upon sensing an appropriate operating voltage first and second detection/classification/UVLO functionality 890 function to independently supply power to DC/DC converter 620. DC/DC converter thus receives a combination of power from two sources, and is thus operable to supply high power to Hi-PD 250. PSE 870 is operable, as will be explained further hereinto below, to ensure appropriate power sharing between power being provided via first and second detection/classification/UVLO functionality 890.

Figure 7A:
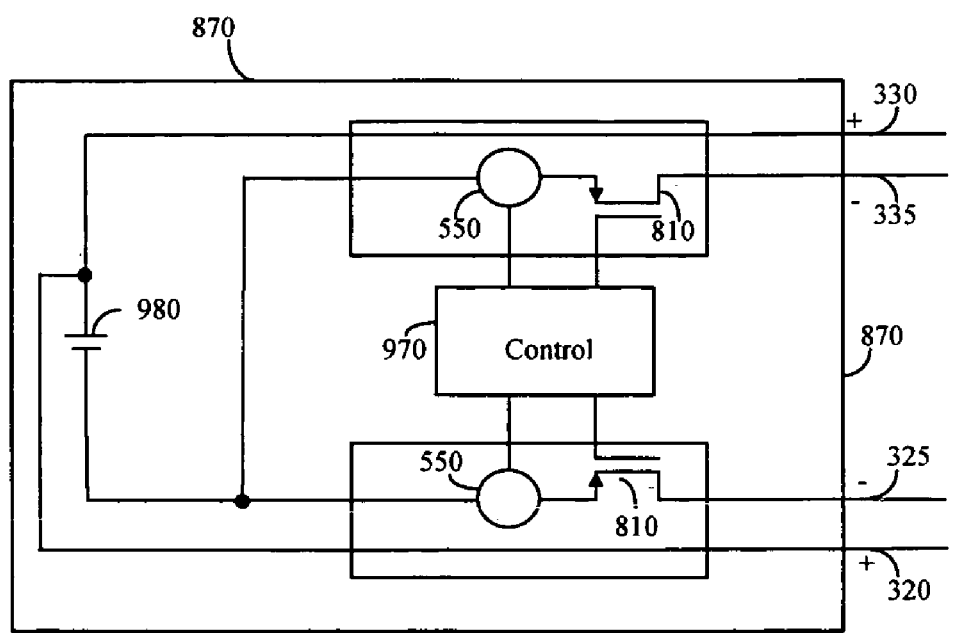
FIG. 7a illustrates a high level block diagram of a first embodiment of a PSE enabling PSE controlled power sharing according to the principle of the current invention.

FIG. 7a illustrates a high level block diagram of a first embodiment of PSE 870 enabling PSE controlled power sharing according to the principle of the current invention. PSE 870 comprises first power source output constituted of positive output lead 320 and negative output lead 325; and second power source output constituted of positive output lead 330 and negative output lead 335. PSE 870 further comprises control circuit 970, first and second current sensors 550, first and second electronically switches 810; and power source 980. At least one of first and second electronically controlled switches 810 is operable as a voltage regulator. Positive output lead 320 and positive output lead 330 are connected to the positive side of power source 980. The negative side of power source 980 is connected through first current sensor 550 and first electronically controlled switch 810 to negative output lead 325. The negative side of power source 980 is further connected through second current sensor 550 and second electronically controlled switch 810 to negative output lead 335. First and second electronically controlled switches 810 are illustrated as FETs on the negative power leg, however this is not meant to be limiting in any way. In an exemplary embodiment, first and second current sensors 550 comprise low value sense resistors.

In operation control circuit 970 monitors the current output of first and second power sources via respective first and second current sensors 550. Control circuit 970 further operates, as will be described further hereinto below, to operate at least one of first and second electronically controlled switch 810 as a voltage regulator. As the voltage drop across the electronically controlled switch 810 operated as a voltage regulator increases, current flowing via the operated electronically controlled switch 810 is reduced, and as a result current flowing in the path represented by the non-operated electronically controlled switch 810 is increased. It is to be understood that what is meant by non-operated is that the electronically controlled switch 810 is in its fully closed position, and is therefore not operating as a voltage regulator. In an exemplary embodiment control circuit 970 in combination with first and second electronically controlled switches 810 further performs detection, optional classification and isolation functionality in conformity with the IEEE 802.3af standard.

The operation of PSE 870 has been described as utilizing electronically controlled switch 810 as both a switch and voltage regulator. This is not meant to be limiting in any way, and electronically controlled switch 810 may be replaced with a linear regulator, switching regulator, or a combination of devices accomplishing voltage regulation without exceeding the scope of the invention. The use of an electronically controlled switch is advantageous, as in a typical PSE meeting the requirements of the IEEE 802.3af standard an electronically controlled switch is implemented to enable power to the port. Thus, a single electronically controlled switch implemented in an FET may be utilized to accomplish both the enabling requirements of the standard and as a voltage regulator means in accordance with the principle of the current invention.

Figure 7B:
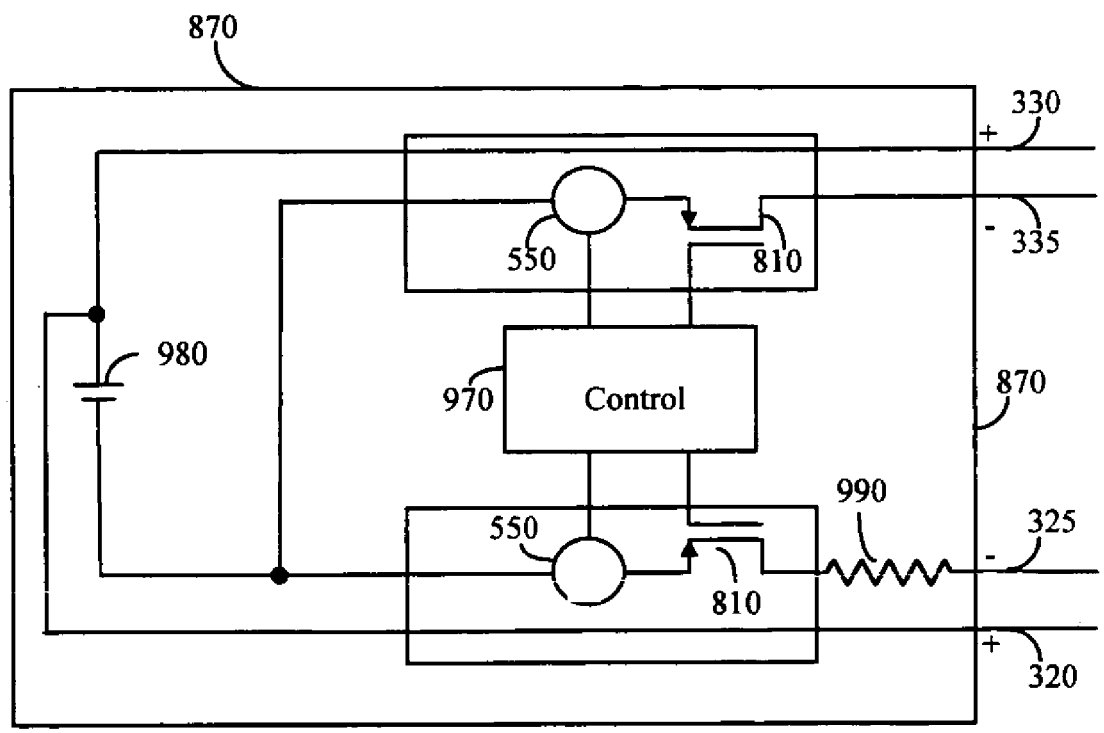
FIG. 7b illustrates a high level block diagram of a second embodiment of a PSE enabling PSE controlled power sharing according to the principle of the current invention.

FIG. 7b illustrates a high level block diagram of a second embodiment of PSE 870 enabling PSE controlled power sharing according to the principle of the current invention. PSE 870 comprises first power source output constituted of positive output lead 320 and negative output lead 325; and second power source output constituted of positive output lead 330 and negative output lead 335. PSE 870 further comprises control circuit 970; first and second current sensors 550: first and second electronically switches 810; unbalancing resistor 990: and power source 980. Positive output lead 320 and positive output lead 330 are connected to the positive side of power source 980. The negative side of power source 980 is connected through first current sensor 550 and first electronically controlled switch 810 through unbalancing resistor 990 to negative output lead 325. The negative side of power source 980 is further connected through second current sensor 550 and second electronically controlled switch 810 to negative output lead 335. Preferably second electronically controlled switch 810 is operable as a voltage regulator. First and second electronically controlled switches 810 are illustrated as FETs on the negative power leg, however this is not meant to be limiting in any way. First electronically controlled switch 810 may be smaller than second electronically controlled switch 810 or located on chip, as only second electronically controlled switch 810 is operated as a voltage regulator. In an exemplary embodiment, first and second current sensors 550 comprise low value sense resistors.

Unbalancing resistor 990 is illustrated as a separate element, however this is not meant to be limiting in any way. Unbalancing resistor 990 may be inherently included in the circuit. In one embodiment unbalancing resistor 990 is included in the selected value for one of the sense resistors utilized as one of first and second current sensors 550. In particular, in network configuration 850 of FIG. 6*a*, unbalancing resistor 990 represents the increased resistance caused by the windings of the secondary of first and second transformers 50 and the primary of third and fourth transformers 50. In network configuration 900 of FIG. 6*b*, unbalancing resistor 990 represents the increased resistance caused by the windings of the secondary of third and fourth transformers 50 and the primary of fifth and sixth transformers 50. First current sensor 550 is provided to allow for operation in accordance as described herein in relation to FIG. 8*b*, or to provide feedback for other current sensing requirements of control circuit 970, however this is not meant to be limiting in any way. In one embodiment first current sensor 550 is not provided.

In operation control circuit 970 monitors the current flow through negative output leads 325, 335 via respective first and second current sensors 550. Unbalancing resistor 990 functions to ensure that a lower voltage is experienced by high powered end station 880 and 920 of FIGS. 6*a*-6*c* via the power path associated with negative output lead 325. The current via the power path associated with negative output lead 335 is thus larger than the current associated with negative output lead 325. Control circuit 970 further operates, as will be described further hereinto below, to operate second electronically controlled switch 810 as a voltage regulator. As the voltage drop across second electronically controlled switch 810 increases, current flowing via second electronically controlled switch 810 is reduced, and as a result current flowing in the path associated with first electronically controlled switch 810 is increased.

The operation of PSE 870 has been described as utilizing second electronically controlled switch 810 as both a switch and voltage regulator. This is not meant to be limiting in any way, and second electronically controlled switch 810 may be replaced with a linear regulator, switching regulator, or a combination of devices accomplishing voltage regulation without exceeding the scope of the invention. The use of an electronically controlled switch is advantageous, as in a typical PSE meeting the requirements of the IEEE 802.3af standard an electronically controlled switch is implemented to enable power to the port. Thus, a single electronically controlled switch implemented in an FET may be utilized to accomplish both the enabling requirements of the standard and as a voltage regulator means in accordance with the principle of the current invention.

Figure 8A:
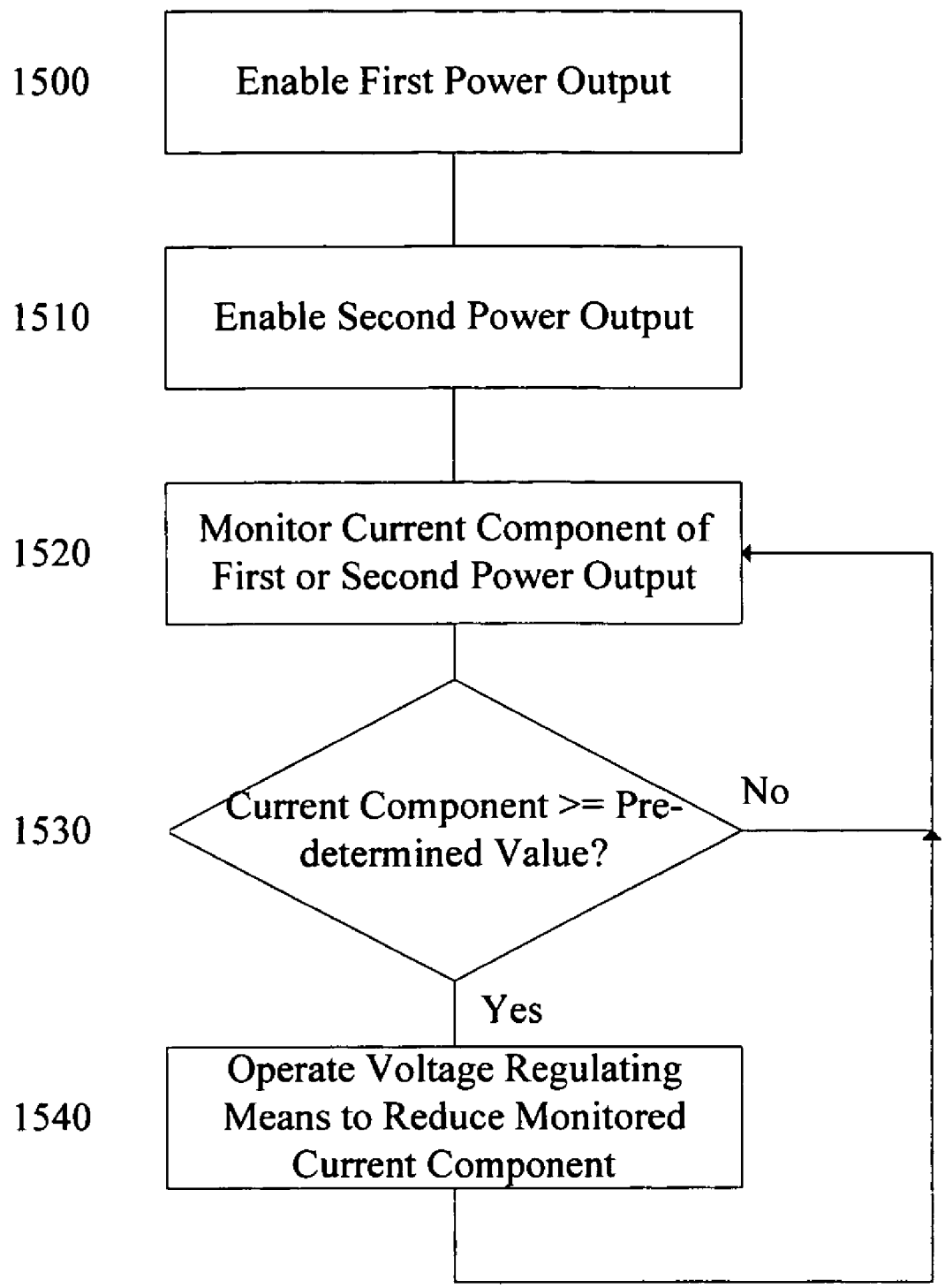
FIG. 8a illustrates a high level flow chart of a first embodiment of the operation of the control circuit of FIGS. 7a and 7b according to the principle of the current invention.

FIG. 8*a* illustrates a high level flow chart of a first embodiment of the operation of control circuit 970 of FIGS. 7*a* and 7*b* according to the principle of the current invention. The operation of control circuit 970 may be governed by a state machine, micro-controller, micro-computer or analog circuitry without exceeding the scope of the invention. In stage 1500 a first power source output is enabled and in stage 1510 a second power source output is enabled. It is to be understood that preferably stages 1500 and 1510 are accomplished after appropriate detection and optionally classification in accordance with the applicable standard. Further preferably stages 1500 and 1510 are accomplished substantially simultaneously to prevent current flow on a first path from saturating prior to enabling a second path.

In stage 1520 the current component of one of the first and second paths is monitored. It is to be understood that the term current component is meant to comprise a current value or other indicator of the current output of the respective power source. In accordance with the embodiment of FIG. 7*a* this is accomplished by control circuit 970 monitoring the output of at least one of first and second current sensor 550. In accordance with the embodiment of FIG. 7*b* this is accomplished by control circuit 970 monitoring the output of second current sensor 550. In stage 1530 the monitored current component is compared with a pre-determined value. In an exemplary embodiment the pre-determined value is less than the maximum allowed output current according to the above mentioned IEEE 802.3af standard.

In the event that in stage 1530 the monitored current component is not greater than or equal to the predetermined value, stage 1520 is performed as described above. In the event that in stage 1530 the monitored component is greater than or equal to the predetermined in stage 1540 the voltage regulating means associated with the monitored current component is operated to reduce the monitored current component. It is to be understood by those skilled in the art that the reduced current component will be supplied via the second path. In one embodiment this is accomplished in steps of discrete values. In another embodiment this is accomplished directly to yield a value less than the predetermined value. Stage 1520 is then performed as described above.

Thus the operation according to FIG. 8*a* controls a monitored current component to be less than a pre-determined value. In the event that first through fourth twisted pair connections 60 of FIGS. 6*a*, 6*b* or the corresponding fifth through eighth twisted pair connections 60 of FIG. 6*c* are of a long length, it will be appreciated that typically control circuit 970 will not be required to reduce the current component via operation of voltage regulating means as current will be appropriately shared through an inherent droop.

The operation according to FIG. 8*a* has been described as having the voltage regulating means associated with the same power source as the monitored component. This is not meant to be limiting in any way. In particular the voltage regulating means may be associated with the non-monitored current without exceeding the scope of the invention. In such an embodiment, current beneath a certain level may be indicative of an excess current in the other path.

Figure 8B:
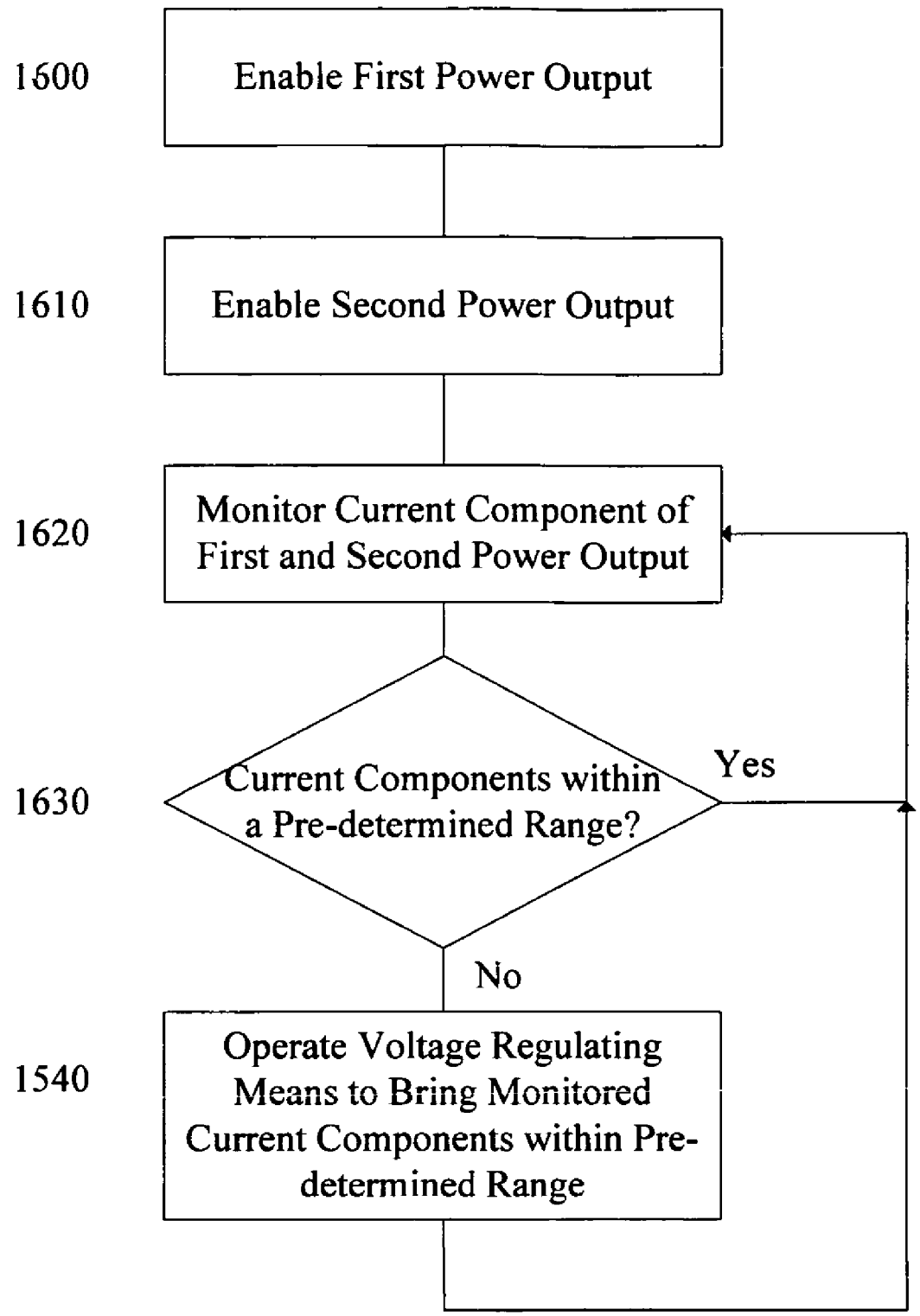
FIG. 8b illustrates a high level flow chart of a second embodiment of the operation of the control circuit of FIGS. 7a and 7b according to the principle of the current invention.

FIG. 8*b* illustrates a high level flow chart of a second embodiment of the operation of control circuit 970 of FIGS. 7*a* and 7*b* according to the principle of the current invention. The operation of control circuit 970 may be governed by a state machine, micro-controller, micro-computer or analog circuitry without exceeding the scope of the invention. In stage 1600 a first power source output is enabled and in stage 1610 a second power source output is enabled. It is to be understood that preferably stages 1600 and 1610 are accomplished after appropriate detection and optionally classification in accordance with the applicable standard. Further preferably stages 1600 and 1610 are accomplished substantially simultaneously to prevent current flow on a first path from saturating prior to enabling a second path.

In stage 1620 the current component of both first and second paths is monitored. In accordance with the embodiments of FIG. 7*a*, 7*b* this is accomplished by control circuit 970 monitoring the output of both first and second current sensor 550. In stage 1630 the monitored current components are compared with a pre-determined range. In an exemplary embodiment the range represents positive and negative values small enough to be considered negligible. In another embodiment the range represents positive and negative values for which it is considered unnecessary to operate the voltage regulating means. It is to be understood the operation of voltage regulating means results in lost power, as the voltage drop across the voltage regulating means results in a power drop across the voltage regulating means.

In the event that in stage 1630 the monitored current components are within the pre-determined range, stage 1620 is performed as described above. In the event that in stage 1630 the monitored components are not within the predetermined range in stage 1640 the voltage regulating means associated with the greater monitored current component is operated to reduce the monitored current component. It is to be understood by those skilled in the art that the reduced current component will be supplied via the other path. In one embodiment this is accomplished in steps of discrete values. In another embodiment this is accomplished directly to yield a value less than the pre-determined range. Stage 1620 is then performed as described above. Thus the operation according to FIG. 8b controls both monitored current component to be within a pre-determined range.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable subcombination. In particular, the invention has been described with an identification of each powered device by a class, however this is not meant to be limiting in any way. In an alternative embodiment, all powered device are treated equally, and thus the identification of class with its associated power requirements is not required.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein.

All publications, patent applications, patents, and other references mentioned herein are incorporated by reference in their entirety. In case of conflict, the patent specification, including definitions, will prevail. In addition, the materials, methods, and examples are illustrative only and not intended to be limiting.

It will be appreciated by persons skilled in the art that the present invention is not limited to what has been particularly shown and described hereinabove. Rather the scope of the present invention is defined by the appended claims and includes both combinations and subcombinations of the various features described hereinabove as well as variations and modifications thereof which would occur to persons skilled in the art upon reading the foregoing description.

We claim:

1. A local area network adapted to supply power over a plurality of communication cabling paths, the local area network comprising:
    a powered device;
    a power sourcing equipment; and
    a communication cabling comprising a plurality of twisted wire pairs connecting said power sourcing equipment to said powered device, said communication cabling providing a first power path comprising a first set of twisted wire pairs of said communication cabling and a second power path comprising a second set of twisted wire pairs of said communication cabling, said first set being different from said second set;
    said power sourcing equipment comprising:
        a control circuit;
        a first power source responsive to said control circuit adapted to supply a first power to said powered device via said first power path; and
        a second power source responsive to said control circuit adapted to supply a second power to said powered device via said second power path,
    said control circuit being operative to:
        supply said first power to said powered device from said first power source via said first power path;
        contemporaneously with said supplied power from said first power source, supply said second power to said powered device from said second power source via said second power path; and
        control said first power source such that a current component of said first power is maintained within a pre-determined range.

2. A local area network according to claim 1, wherein said pre-determined range is a pre-determined limit of the difference between said current component of said first power and a current component of said second power.

3. A local are network according to claim 1, wherein said pre-determined range is a pre-determined maximum, said maximum being less than a maximum allowable current from said first power source.

4. A local area network according to claim 1, further comprising a current sensing means associated with one of said first power source and said second power source, said current sensing means being operatively connected to said control circuit, said control circuit being operative responsive to said current sensing means.

5. A local area network according to claim 1, further comprising a voltage regulating means associated with one of said first power source and said second power source, said voltage regulating means being responsive to said control circuit, said control of said first power source being a result of said voltage regulating means.

6. A local area network according to claim 5, wherein said voltage regulating means comprises one of a linear regulator and a switching regulator.

7. A local area network according to claim 5, wherein said voltage regulating means comprises an FET acting as a linear regulator.

8. A local area network according to claim 1, further comprising an unbalance resistor associated with one of said first power path and said second power path.

9. A local area network according to claim 1, wherein said control circuit is further operative to control said second power source.

10. A local area network according to claim 1, wherein said power sourcing equipment is associated with midspan power insertion equipment.

11. A local area network according to claim 1, wherein said power sourcing equipment is associated with endpoint power insertion equipment.

12. A local area network according to claim 1, wherein said communication cabling is adapted for communicating data to and from said powered device according to at least one of 10 Base-T, 100 Base-T and 1000 Base-T.

13. A local area network according to claim 1, further comprising an under-voltage lockout circuit associated with said powered device, said under-voltage lockout circuit being operative to sense said supplied first power and said contemporaneously supplied second power, said under-voltage lockout circuit being further operative to enable power to said powered device responsive to said sensed supplied first power and said sensed contemporaneously supplied second power.

14. A local area network according to claim 1, wherein said powered device comprises one of: a wireless access point; a laptop computer; a desk top computer; a security camera having at least one of pan, tilt and zoom functionality; and an entrance control device.

15. Power sourcing equipment providing a plurality of power sources for connection over communication cabling to a single powered device, the power sourcing equipment comprising:
  a control circuit;
  a first power source responsive to said control circuit operative to supply power to the single powered device over communication cabling;
  a second power source responsive to said control circuit operative to supply power to the single power device over communication cabling contemporaneously with said supplied power of said first power source;
  a current sensor adapted to monitor an output current of said first power source supplying said power to the single powered device, said current sensor being operatively connected to said control circuit; and
  a voltage regulating means associated with one of said first power source and said second power source, said voltage regulating means being responsive to said control circuit,
  said control circuit being operative responsive to said monitored output current to operate said voltage regulating means so as to maintain said monitored output current within a pre-determined range.

16. Power sourcing equipment according to claim 15, wherein said pre-determined range is a pre-determined limit of a difference between a current output of said first power source supplying said power to the single powered device and a current output of said second power source contemporaneously supplying said power to the single powered device.

17. Power sourcing equipment according to claim 15, wherein said pre-determined range is a pre-determined maximum, said maximum being less than a maximum allowed current output of said first power source.

18. Power sourcing equipment according to claim 15, wherein said voltage regulating means comprises one of a linear regulator and a switching regulator.

19. Power sourcing equipment according to claim 15, wherein said voltage regulating means comprises an FET acting as a linear regulator.

20. Power sourcing equipment according to claim 15, further comprising an unbalance resistor associated with one of said first power source and said second power source.

21. A method for sharing power providing to a powered device over communication cabling, the method comprising:
  supplying a first power to a powered device over communication cabling via a first path;
  monitoring a current of said supplied first power;
  supplying a second power to said powered device over communication cabling via a second path contemporaneously with said supplied first power, said first path being different than said second path; and
  regulating a voltage associated with one of said supplied first power and said supplied second power responsive to said monitored current so as to maintain said monitored current within a pre-determined range.

22. A method according to claim 21, wherein said pre-determined range is a pre-determined limit of a difference between said monitored current of said supplied first power and a current of said second power source.

23. A method according to claim 21, wherein said pre-determined range is a pre-determined maximum, said maximum being less than a maximum allowed current of said first supplied power.

24. A method according to claim 22, further comprising:
  monitoring a current of said supplied second power, wherein said pre-determined range is a pre-determined limit of a difference between said monitored current of said supplied first power and said monitored current of said supplied second power.

* * * * *

UNITED STATES PATENT AND TRADEMARK OFFICE
CERTIFICATE OF CORRECTION

| | | |
|---|---|---|
| PATENT NO. | : 7,299,368 B2 | Page 1 of 1 |
| APPLICATION NO. | : 11/036063 | |
| DATED | : November 20, 2007 | |
| INVENTOR(S) | : Arkadiy Peker et al. | |

It is certified that error appears in the above-identified patent and that said Letters Patent is hereby corrected as shown below:

Col. 34, Line 34, Should Read:
    24. A method according to claim "21", further comprising Signed and Sealed this Eighth Day of April, 2008

JON W. DUDAS
*Director of the United States Patent and Trademark Office*